(12) United States Patent
Burdoucci

(10) Patent No.: US 10,820,430 B2
(45) Date of Patent: Oct. 27, 2020

(54) SYSTEM AND METHOD FOR INTERACTIVE PROTECTION OF A MOBILE ELECTRONIC DEVICE

(71) Applicant: Romello Burdoucci, Germantown, TN (US)

(72) Inventor: Romello Burdoucci, Germantown, TN (US)

(*) Notice: Subject to any disclaimer, the term of this patent is extended or adjusted under 35 U.S.C. 154(b) by 0 days.

(21) Appl. No.: 16/554,744

(22) Filed: Aug. 29, 2019

(65) Prior Publication Data

US 2019/0387635 A1 Dec. 19, 2019

Related U.S. Application Data

(62) Division of application No. 15/484,105, filed on Apr. 10, 2017, now Pat. No. 10,405,440.

(51) Int. Cl.
| | | |
|---|---|---|
| *G06F 1/16* | (2006.01) | |
| *H05K 5/00* | (2006.01) | |
| *H05K 7/00* | (2006.01) | |
| *H05K 5/03* | (2006.01) | |
| *H05K 5/06* | (2006.01) | |
| *B25J 9/00* | (2006.01) | |
| *H04M 1/00* | (2006.01) | |
| *H04M 1/18* | (2006.01) | |

(52) U.S. Cl.
CPC .............. *H05K 5/0086* (2013.01); *B25J 9/00* (2013.01); *H04M 1/00* (2013.01); *H04M 1/185* (2013.01); *H05K 5/03* (2013.01); *H05K 5/069* (2013.01); *H04M 2250/12* (2013.01)

(58) Field of Classification Search
CPC ......... H05K 5/03; H05K 5/069; H05K 5/0086

USPC ................ 361/679.56, 679.3; 307/650–653; 267/136; 702/141

See application file for complete search history.

(56) References Cited

U.S. PATENT DOCUMENTS

| | | | |
|---|---|---|---|
| 1,119,732 | A | 12/1914 | Tesla |
| 2,767,943 | A | 10/1956 | Janney |
| 3,285,544 | A | 11/1966 | Chope |
| 3,446,980 | A | 5/1969 | Meier |
| 3,631,737 | A | 1/1972 | Wells |
| 3,951,510 | A | 4/1976 | Lloyd |

(Continued)

FOREIGN PATENT DOCUMENTS

| | | |
|---|---|---|
| CN | 102545294 | 7/2012 |
| CN | 202770037 | 3/2013 |

(Continued)

OTHER PUBLICATIONS

Tesla To Launch EV Battery Swap Network. Edmonds.com. Jun. 21, 2013.

(Continued)

*Primary Examiner* — Anthony M Haughton
(74) *Attorney, Agent, or Firm* — Terry M. Sanks, Esq.; Beusse Sanks, PLLC

(57) ABSTRACT

A system is disclosed having a deployable barrier, a sensor to detect when to deploy the barrier and an activation device to deploy the barrier, wherein the barrier, sensor and activation device are connected a surface attached to a mobile device and the deployable barrier is deployed when the mobile device experiences an unexpected change in at least one of velocity, acceleration and moisture. Another system and method are also disclosed.

20 Claims, 15 Drawing Sheets

(56) References Cited

U.S. PATENT DOCUMENTS

| | | |
|---|---|---|
| 4,087,919 A | 5/1978 | Huvers |
| 4,142,379 A | 3/1979 | Kuklinski |
| 4,218,827 A | 8/1980 | Huvers |
| 4,219,162 A | 8/1980 | Dadson |
| 4,239,129 A | 12/1980 | Esposito |
| 4,442,753 A | 4/1984 | Pouri |
| 4,694,639 A | 9/1987 | Chen |
| 4,706,848 A | 11/1987 | D'Andrade |
| 4,736,673 A | 4/1988 | Harada |
| 4,777,785 A | 10/1988 | Rafaels |
| 4,818,990 A | 4/1989 | Fernandes |
| 4,903,154 A | 2/1990 | Costas |
| 4,989,400 A | 2/1991 | Wark |
| 5,016,849 A | 5/1991 | Wu |
| 5,050,771 A | 9/1991 | Hanson |
| 5,203,302 A | 4/1993 | Parnitzke |
| 5,204,814 A | 4/1993 | Noonan |
| 5,325,765 A | 6/1994 | Sylvan |
| 5,343,391 A | 8/1994 | Mushabac |
| 5,367,836 A | 11/1994 | Allen |
| 5,638,574 A | 6/1997 | Haupt |
| 5,686,810 A | 11/1997 | Yasui |
| 5,740,987 A | 4/1998 | Morris |
| 5,777,578 A | 7/1998 | Chang et al. |
| 5,799,900 A | 9/1998 | McDonnell |
| 5,840,189 A | 11/1998 | Sylvan |
| 5,868,100 A | 2/1999 | Marsh |
| 5,898,290 A | 4/1999 | Beard |
| 5,916,111 A | 6/1999 | Colens |
| 5,974,347 A | 10/1999 | Nelson |
| 6,044,632 A | 4/2000 | Schmalz |
| 6,076,265 A | 6/2000 | Huang Lo |
| 6,082,247 A | 7/2000 | Beaulicu |
| 6,085,663 A | 7/2000 | Powell |
| 6,255,793 B1 | 7/2001 | Peless |
| 6,275,773 B1 | 8/2001 | Lemelson |
| 6,278,918 B1 | 8/2001 | Dickson |
| 6,321,515 B1 | 11/2001 | Colens |
| 6,338,013 B1 | 1/2002 | Ruffner |
| 6,385,515 B1 | 5/2002 | Dickson |
| 6,400,996 B1 | 6/2002 | Hoffberg |
| 6,427,944 B1 | 8/2002 | Passman |
| 6,443,251 B1 | 9/2002 | Morrell |
| 6,502,017 B2 | 12/2002 | Ruffner |
| 6,519,143 B1 | 2/2003 | Goko |
| 6,544,634 B1 | 4/2003 | Abrams |
| 6,600,981 B2 | 7/2003 | Ruffner |
| 6,604,348 B2 | 8/2003 | Hunt |
| 6,611,738 B2 | 8/2003 | Ruffner |
| 6,615,108 B1 | 9/2003 | Peless |
| 6,619,128 B1 | 9/2003 | Hui |
| 6,650,975 B2 | 9/2003 | Ruffner |
| 6,634,593 B2 | 10/2003 | Lepretre |
| 6,686,951 B1 | 2/2004 | Dickson |
| 6,690,796 B1 | 2/2004 | Farris |
| 6,720,099 B1 | 4/2004 | Haltiner |
| 6,763,282 B2 | 7/2004 | Glenn |
| 6,841,909 B2 | 1/2005 | Six |
| 6,850,024 B2 | 2/2005 | Peless |
| D502,362 S | 3/2005 | Lazaris |
| 6,879,878 B2 | 4/2005 | Glenn |
| 6,885,912 B2 | 4/2005 | Peless |
| 6,901,695 B2 | 6/2005 | Lindroth |
| 6,966,168 B1 | 11/2005 | Kerr |
| 6,984,952 B2 | 1/2006 | Peless |
| 6,986,238 B1 | 1/2006 | Bloodworth |
| 6,988,293 B2 | 1/2006 | Ritter |
| 6,994,575 B1 | 2/2006 | Clark |
| 7,048,506 B2 | 5/2006 | Atmur |
| 7,053,580 B2 | 5/2006 | Aldred |
| 7,066,291 B2 | 6/2006 | Martins |
| 7,069,111 B2 | 6/2006 | Glenn |
| 7,082,350 B2 | 7/2006 | Skoog |
| 7,089,099 B2 | 8/2006 | Shostak |
| 7,103,457 B2 | 9/2006 | Dean |
| 7,107,132 B2 | 9/2006 | Dean |
| 7,117,660 B1 | 10/2006 | Colens |
| 7,121,214 B1 | 10/2006 | Toltzman et al. |
| 7,152,328 B2 | 12/2006 | Champlin |
| 7,165,488 B2 | 1/2007 | Bragg |
| 7,239,944 B2 | 7/2007 | Dean |
| 7,260,844 B2 | 8/2007 | Tidwell et al. |
| 7,318,493 B2 | 1/2008 | Medina |
| 7,347,138 B2 | 3/2008 | Bragg |
| 7,349,759 B2 | 3/2008 | Peless |
| 7,374,130 B2 | 5/2008 | Atmur |
| 7,377,162 B2 | 5/2008 | Lazaris |
| 7,418,346 B2 | 8/2008 | Breed |
| 7,424,766 B2 | 9/2008 | Reindle |
| 7,429,843 B2 | 9/2008 | Jones |
| 7,440,826 B2 | 10/2008 | Franceschini |
| 7,469,540 B1 | 12/2008 | Knapton |
| 7,532,541 B2 | 5/2009 | Govindswamy |
| 7,538,715 B2 | 5/2009 | Langford |
| 7,542,284 B1 | 6/2009 | Wilson, Sr. |
| 7,564,408 B2 | 7/2009 | Glockler |
| 7,567,052 B2 | 7/2009 | Jones |
| 7,579,803 B2 | 8/2009 | Jones |
| 7,599,758 B2 | 10/2009 | Reindle |
| 7,663,333 B2 | 2/2010 | Jones |
| 7,720,366 B2 | 5/2010 | Iwasaki |
| 7,729,801 B2 | 6/2010 | Abramson |
| 7,743,683 B2 | 6/2010 | Dayton |
| 7,787,989 B2 | 8/2010 | Colens |
| 7,796,081 B2 | 9/2010 | Breed |
| 7,840,355 B2 | 11/2010 | Breed |
| 7,873,437 B2 | 1/2011 | Aldred |
| 7,913,345 B2 | 3/2011 | Dayton |
| 7,958,640 B1 | 6/2011 | Mandriota |
| 7,957,899 B2 | 7/2011 | Changey |
| 7,980,510 B2 | 7/2011 | Tanabe |
| 7,987,611 B2 | 8/2011 | Taylor |
| 8,024,995 B2 | 9/2011 | Dayton |
| 8,060,987 B1 | 11/2011 | Troudt |
| 8,061,679 B2 | 11/2011 | Lord |
| 8,132,759 B2 | 3/2012 | Von Thal |
| 8,136,333 B1 | 3/2012 | Levin |
| 8,142,083 B2 | 3/2012 | Brown |
| 8,156,655 B2 | 4/2012 | Gatten |
| 8,191,268 B2 | 6/2012 | Willetts |
| 8,234,010 B2 | 7/2012 | Thompson |
| 8,234,848 B2 | 8/2012 | Messina |
| 8,275,506 B1 | 9/2012 | Bishel |
| 8,295,979 B2 | 10/2012 | Thacher |
| 8,306,659 B2 | 11/2012 | Abramson |
| 8,330,305 B2 * | 12/2012 | Hart ............ H04M 1/185 307/650 |
| 8,336,282 B2 | 12/2012 | Messina |
| 8,352,113 B2 | 1/2013 | Johnson |
| 8,359,142 B2 | 1/2013 | Hoffman |
| 8,364,309 B1 | 1/2013 | Bailey |
| 8,368,339 B2 | 2/2013 | Jones |
| 8,373,110 B2 | 2/2013 | Fang |
| 8,374,721 B2 | 2/2013 | Halloran |
| 8,390,251 B2 | 3/2013 | Cohen |
| 8,412,466 B2 | 4/2013 | Kanderian |
| 8,418,898 B2 | 4/2013 | Carlsson |
| 8,433,468 B2 | 4/2013 | Johnson |
| 8,436,438 B2 | 5/2013 | Bessho |
| 8,439,449 B1 | 5/2013 | Bailey |
| 8,456,159 B2 | 6/2013 | Polzer |
| 8,461,803 B2 | 6/2013 | Cohen |
| 8,473,187 B2 | 6/2013 | Kammel |
| 8,478,442 B2 | 7/2013 | Casey |
| 8,485,330 B2 | 7/2013 | Pack |
| 8,506,180 B2 | 8/2013 | Brown |
| 8,525,688 B2 | 9/2013 | Chatterjee |
| 8,549,826 B2 | 10/2013 | Kraft |
| 8,584,305 B2 | 11/2013 | Won |
| 8,600,553 B2 | 12/2013 | Svendsen |
| 8,600,662 B2 | 12/2013 | Clark |
| 8,618,766 B2 | 12/2013 | Anderson |
| 8,634,960 B2 | 1/2014 | Sandin |
| 8,635,015 B2 | 1/2014 | Anderson |

(56) References Cited

U.S. PATENT DOCUMENTS

| | | |
|---|---|---|
| 8,666,550 B2 | 3/2014 | Anderson |
| 8,666,554 B2 | 3/2014 | Anderson |
| 8,676,503 B2 | 3/2014 | Johnson |
| 8,706,322 B2 | 4/2014 | Johnson |
| 8,706,339 B2 | 4/2014 | Thompson |
| 8,707,569 B1 | 4/2014 | Peterson |
| 8,715,133 B2 | 5/2014 | Sappenfield |
| 8,725,316 B2 | 5/2014 | Thompson |
| 8,731,295 B2 | 5/2014 | Schepelmann |
| 8,749,196 B2 | 6/2014 | Cohen |
| 8,770,022 B2 | 7/2014 | Douglas |
| 8,780,542 B1 | 7/2014 | Dariavach |
| 8,781,627 B2 | 7/2014 | Sandin |
| 8,796,885 B2 | 8/2014 | Tan |
| 8,812,284 B2 | 8/2014 | Damiani |
| 8,838,274 B2 | 9/2014 | Jones |
| 8,849,523 B1 | 9/2014 | Chan |
| 8,851,784 B2 | 10/2014 | Donohue |
| 8,854,001 B2 | 10/2014 | Cohen |
| 8,857,137 B2 | 10/2014 | Avnery |
| 8,858,111 B2 | 10/2014 | Donohue |
| 8,862,431 B2 | 10/2014 | Hodge |
| 8,868,237 B2 | 10/2014 | Sandin |
| 8,874,283 B1 | 10/2014 | Cavote |
| 8,886,222 B1 | 11/2014 | Rodriguez |
| 8,886,384 B2 | 11/2014 | Chung |
| 8,930,044 B1 | 1/2015 | Peeters |
| 8,933,876 B2 | 1/2015 | Galor |
| 8,937,591 B2 | 1/2015 | Julian |
| 8,938,318 B2 | 1/2015 | Bergstrom |
| 8,942,862 B2 | 1/2015 | Markusson |
| 8,954,192 B2 | 2/2015 | Ozick |
| 8,954,193 B2 | 2/2015 | Sandin |
| 8,958,654 B1 | 2/2015 | Evans |
| 8,966,806 B2 | 3/2015 | Sammut |
| 8,989,776 B2 | 3/2015 | Edwards |
| 9,004,973 B2 | 4/2015 | Condon |
| 9,013,617 B2 | 4/2015 | Ramachandran |
| 9,014,848 B2 | 4/2015 | Farlow |
| 9,019,508 B2 | 4/2015 | Blacklaw |
| 9,020,638 B2 | 4/2015 | Iida |
| 9,021,777 B2 | 5/2015 | Johnson |
| 9,022,999 B2 | 5/2015 | Bangera |
| 9,024,772 B2 | 5/2015 | Wang |
| 9,024,842 B1 | 5/2015 | Prada Gomez |
| 9,026,299 B2 | 5/2015 | Johnson |
| 9,030,382 B2 | 5/2015 | Horberg |
| 9,030,407 B2 | 5/2015 | Ronkainen |
| 9,030,419 B1 | 5/2015 | Freed |
| 9,030,495 B2 | 5/2015 | McCulloch |
| 9,031,273 B2 | 5/2015 | Dong |
| 9,031,779 B2 | 5/2015 | Djugash |
| 9,043,952 B2 | 6/2015 | Sandin |
| 9,043,953 B2 | 6/2015 | Sandin |
| 9,044,861 B2 | 6/2015 | Gomi |
| 9,052,752 B2 | 6/2015 | Mason |
| 9,052,885 B2 | 6/2015 | Naffziger |
| 9,052,896 B2 | 6/2015 | Schillings |
| 9,055,220 B1 | 6/2015 | Kozko |
| 9,706,028 B1* | 7/2017 | Hart ............... H04M 1/185 |
| 9,819,381 B2* | 11/2017 | Choi ............... H04M 1/185 |
| 2001/0049039 A1 | 12/2001 | Haltiner |
| 2003/0136874 A1 | 7/2003 | Gjerdrum |
| 2004/0156699 A1 | 8/2004 | Park |
| 2005/0035148 A1 | 2/2005 | Zimmerman |
| 2005/0262842 A1 | 12/2005 | Claassen |
| 2007/0094195 A1 | 4/2007 | Wang |
| 2008/0140278 A1 | 6/2008 | Breed |
| 2008/0144944 A1 | 6/2008 | Breed |
| 2008/0147280 A1 | 6/2008 | Breed |
| 2008/0161986 A1 | 7/2008 | Breed |
| 2008/0161987 A1 | 7/2008 | Breed |
| 2009/0030605 A1 | 1/2009 | Breed |
| 2010/0164152 A1* | 7/2010 | Li ............... H04M 1/185 |
| | | 267/140.15 |
| 2010/0278523 A1 | 11/2010 | Brown |
| 2010/0288520 A1 | 11/2010 | Dayton |
| 2010/0326031 A1 | 12/2010 | Branden |
| 2011/0043579 A1 | 2/2011 | Leppanen |
| 2011/0068094 A1 | 3/2011 | Pan |
| 2011/0194230 A1* | 8/2011 | Hart ............... H04M 1/185 |
| | | 361/437 |
| 2011/0216060 A1 | 9/2011 | Weising |
| 2012/0071217 A1 | 3/2012 | Park |
| 2012/0211288 A1 | 8/2012 | Afanador |
| 2013/0128043 A1 | 5/2013 | Avnery |
| 2013/0168171 A1 | 7/2013 | Buell |
| 2013/0181511 A1 | 7/2013 | Stewart |
| 2013/0187591 A1 | 7/2013 | Stewart |
| 2014/0254896 A1 | 9/2014 | Zhou |
| 2014/0336781 A1 | 11/2014 | Katyal |
| 2015/0085126 A1 | 3/2015 | Avnery |
| 2015/0149035 A1 | 5/2015 | Enthaler |
| 2015/0331456 A1* | 11/2015 | Moon ............... H04M 1/185 |
| | | 361/51 |
| 2016/0179097 A1 | 6/2016 | Chua et al. |
| 2016/0272333 A1 | 9/2016 | Heinonen |

FOREIGN PATENT DOCUMENTS

| | | |
|---|---|---|
| CN | 105438472 | 3/2016 |
| EP | 2974780 | 1/2016 |
| WO | 2013165819 | 11/2013 |
| WO | 2016044793 | 3/2016 |

OTHER PUBLICATIONS

Wireless Energy Transfer.
A More Efficient Engine. MIT Technology Review. 2007, MIT Laboratory for Energy and the Environment.
A Tiny Robotic Hand, MIT Technology Review. 2007. MIT Laboratory for Robotics.
Easy and Simple Arduino Robot Arm. Autodesk. 2014.
Energy Efficient Multipath Data Fusion Technique for Wireless Sensor Networks. Network Security. 2012.
The Benefits of a Good Electric Pole Saw. HubPags. 2014.
Engine Efficiency. Wikipedia. 2015.
Here's How Many People Have Registered Their Drones, Fortune. com, 2016.
Minimum Energy Information Fusion in Sensor Networks. 1999, Lawrence Lovermore National Laboratory.
Apple Wins Patent for Inductive Charging Docking station. CNET. 2012.
Apple Granted a Major Magnetic Resonance Power System Patent. Patently.
Apple Reveals Master Details of Wireless Charging System. Patently Apple. 2013.
Apples Wireless Charging Patent Might Actually Free Us From Wires. Wired. 2012.
Close Encounters of a Drone Kind, R&D. 2015.
This Pressure Cooker Generates Its Own. Reviewed.com, 201 5.
What is a gimbal—and what does it have to do with NASA? HowStuffWorks.com.
Tesla To Launch EV Battery Swap Network. Edmunds.com, 2013.
Decentralized Sensor Fusion for Ubiquitous Networking robotics in urban areas.
Context-Aided Sensor Fusion for Enhanced Urban Navigation. MDPI. 2012.
A Radiosonde Using a Humidity Sensor Array with a Platinum Resistance Heater and Multi-Sensor Data Fusion.
Dynamic Reweighting of Three Modalities for Sensor.
Nakamichi RX-505 Audio cassette deck with UniDirectional Auto Reverse.
Wireless Communication The Comparative Study Between Broadcasting Satellite Communication and Cellular Service.
Unmanned drone, robot system for delivering mail, goods, humanoid securit.

(56) References Cited

OTHER PUBLICATIONS

International Search Report, dated Dec. 4, 2017.

* cited by examiner

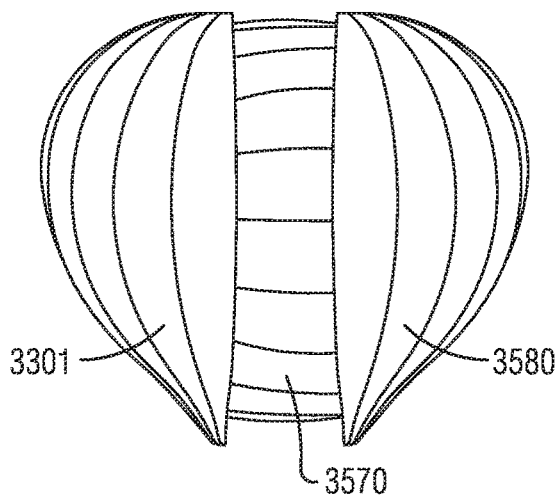
FIG. 5
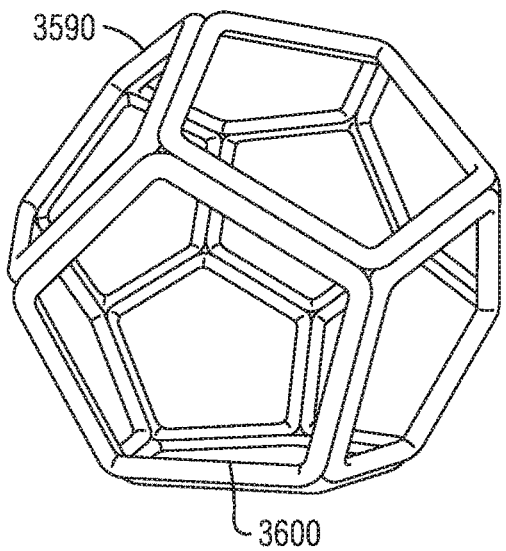
FIG. 6
FIG. 7

FIG. 28

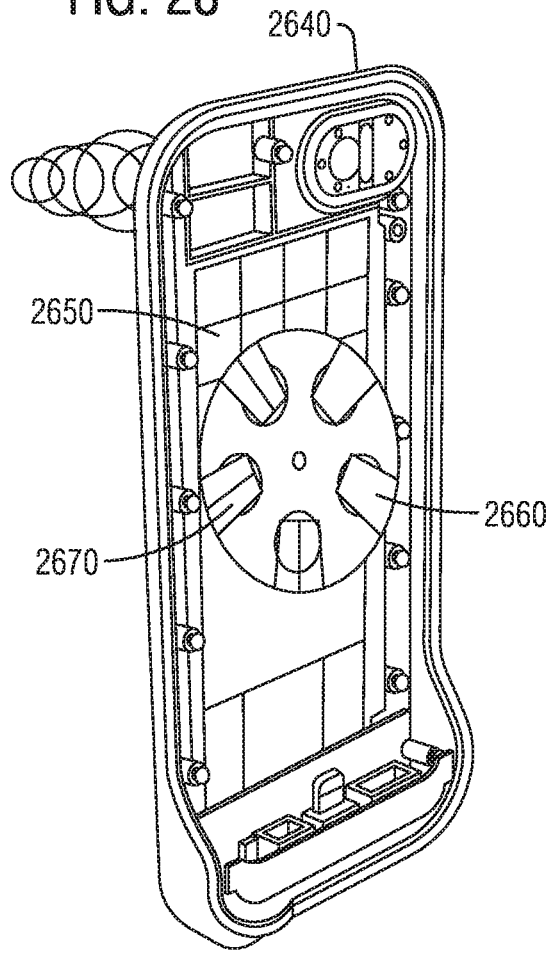

FIG. 29

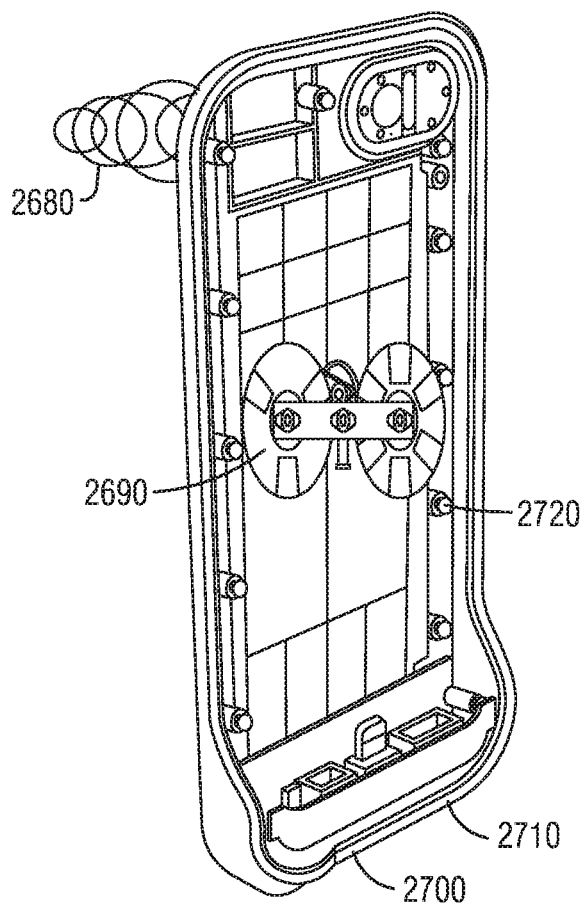

FIG. 31

Detecting, with a sensor, an unexpected change in at least one of velocity, acceleration and moisture of a mobile device Deploying, with an activation device, a deployable barrier, stored to a cover that is attached to at least a part of the mobile cover, to protect the mobile device from damage When to deploy the deployable barrier with a processor in communication with the sensor

SYSTEM AND METHOD FOR INTERACTIVE PROTECTION OF A MOBILE ELECTRONIC DEVICE

CROSS-REFERENCE TO RELATED APPLICATIONS

This application is a Divisional of U.S. application Ser. No. 15/484,105 filed Apr. 10, 2017, and incorporated herein by reference in its entirety.

BACKGROUND

Embodiments relate to a protective cover and, more particularly, a system for protecting a mobile electronic device while also providing added enhancements to the mobile electronic device.

Mobile electronic devices, such as, but not limited to laptop computers, tablet computers, smart phones, etc. have increased in use. With their increased use, such as, but not limited to, as an information portal, when mobile a limitation of mobile electronic devices is that is battery life.

Another issue that users encounter is safety concerns. Safety concerns involve two primary areas. Physically protecting a mobile electronic device if the device is dropped or has something dropped on it. As an example, a mobile electronic device may be accidentally dropped on to a solid surface or into a liquid. Likewise, either a solid object or a liquid may be dropped on the mobile electronic device.

Despite the alarming statistics on mobile device accidents, most people choose to purchase a phone and protective case and screen protector at the time of activation. The protective cases of today are usually manufactured plastic mostly produced from injection molded plastic with some having soft inner parts and having molded to fit and protect the mobile electronic devices. The largest use of cases is by common consumers wanting to protect their device investment in sporting or everyday use. In spite of this, all protective cases seem to resemble each other offering limited levels of proven protection. The cases available today present inadequate levels of protection from accidental damage events in every day or extreme activities. These cases fail to protect the screen from radiating shockwaves generated from a corner or elongated plane accidental drop causing the reverberation of the shock waves to splinter the phone or tablet touch screen or cause the inner workings of the hardware's integrity to be compromised resulting in adverse performance experiences by the user. Furthermore, they do not absorb the force of the device's collision in an optimal manner since both the case and the electronic device is made of an inelastic hard material. Even if the device is not visibly damaged, there may be severe internal damage to the electronic components. During extreme weather or in extreme climates where the temperature is either abnormally high in heat or low with cold, the electronic device can adopt an even more sensitive state of being resulting in cataclysmic internal damage despite no apparent damage to the existing cases being offered.

The other safety concerns involves having a mobile electronic device stolen. Since the mobile electronic device is not secured to a particular location, possibilities exist for a user to inadvertently leave the mobile electronic device at a location, where the user was using the mobile electronic device. Also, there are thieves who watch an owner of a mobile electronic device and wait for an opportunity to steal such a mobile electronic device.

Manufacturers and owners of mobile electronic devices would benefit from a system that not only protects mobile electronic devices from being lost, stolen or damaged, but with providing enhancements to the functionality of the mobile electronic devices.

SUMMARY

Embodiments relate to a system and a method for protecting and enhancing a mobile electronic device. The system comprises a deployable barrier, a sensor to detect when to deploy the barrier and an activation device to deploy the barrier, wherein the barrier, sensor and activation device are connected a surface attached to a mobile device and the deployable barrier is deployed when the mobile device experiences an unexpected change in at least one of velocity, acceleration and moisture.

Another system comprises a deployable barrier to protect a mobile device when the mobile device experiences an unexpected change in at least one of velocity, acceleration and moisture. The system also comprises a sensor to detect when the mobile device experiences an unexpected change in at least one of velocity, acceleration, and moisture. The system also comprises an activation device that cause the deployable barrier to deploy from a stored location to provide protection to at least one of all and a specific section of the mobile device.

The method comprises detecting, with a sensor, an unexpected change in at least one of velocity, acceleration and moisture of a mobile device. The method also comprises deploying, with an activation device, a deployable barrier, stored to a cover that is attached to at least a part of the mobile cover, to protect the mobile device from damage.

BRIEF DESCRIPTION OF THE DRAWINGS

A more particular description briefly stated above will be rendered by reference to specific embodiments thereof that are illustrated in the appended drawings. Understanding that these drawings depict only typical embodiments and are not therefore to be considered to be limiting of its scope, the embodiments will be described and explained with additional specificity and detail through the use of the accompanying drawings in which:

FIGS. 5-8 show other embodiments of the pouch arrangement;

FIGS. 28 and 29 show other embodiments of components that may be included to enhance the mobile device;

FIG. 31 shows an illustrative computing functionality that may be used to components on the additive manufacturing device.

DETAILED DESCRIPTION

Figure 1:
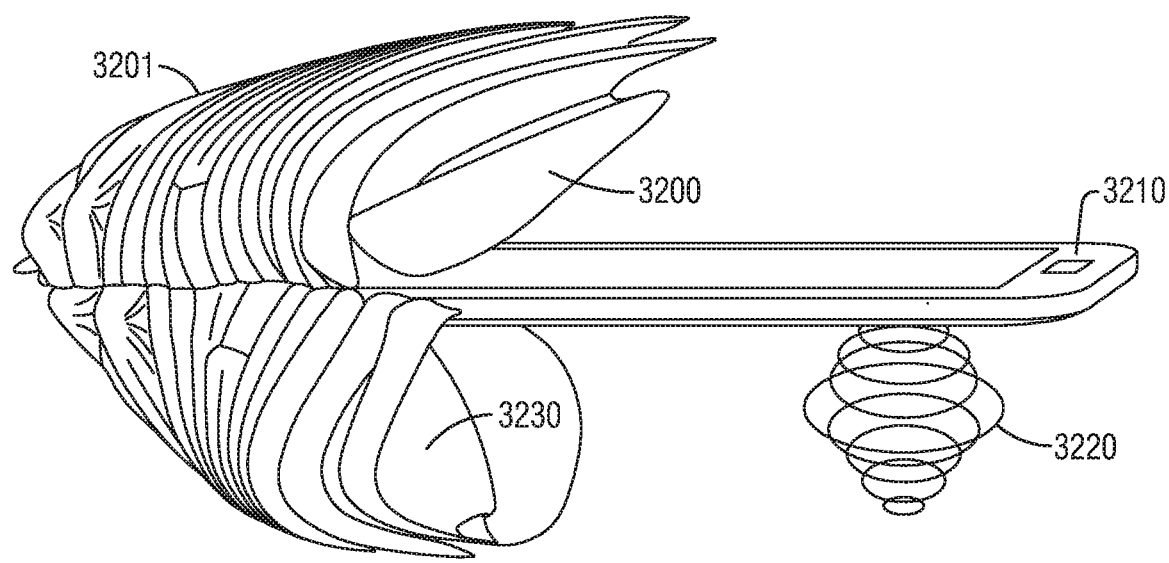
FIG. 1 shows an embodiment of a protective mobile device case partially deployed.

Embodiments are described herein with reference to the attached figures wherein like reference numerals are used throughout the figures to designate similar or equivalent elements. The figures are not drawn to scale and they are provided merely to illustrate aspects disclosed herein. Several disclosed aspects are described below with reference to non-limiting example applications for illustration. It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. The embodiments are not limited by the illustrated ordering of acts or events, as some acts may occur in different orders and/or concurrently with other acts or events. Furthermore, not all illustrated acts or events are required to implement a methodology in accordance with the embodiments.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

As disclosed herein, a protective enclosure for an electronic device such as, but not limited to, a laptop computer or tablet computer, a smart phone, camera, handheld electronic device (such as, but not limited to a multi-meter), etc. that comprises a shell that is capable of enclosing and substantially surrounding the electronic device. The shell is substantially watertight, substantially rigid and substantially crush-resistant. The inside of the shell may have a hook and loop liner with shock absorbing corner bumpers having hook and loop type bases so that the bumpers may attach at any point on the liner inside the shell to accommodate electronic devices of various sizes and to secure the device inside the enclosure in a shock absorbent suspended manner. The shell may further comprise a USB connector hub for connection to the USB port of a laptop computer or PC tablet enclosed in the protective shell. As explained further herein, other enhancements may be provided within the shell to further improve operability of the mobile electronic device.

The protective case may provide for features in its design and structure to provide greater protection to the mobile electronic device where specific parts of the mobile electronic device, such as, but not limited to a screen, is prone to damage upon the occurrence of a crash accident. In an embodiment, an air bag and pressure impact sensor mechanism are provided in combination with the protective case to provide for protective crash encasement. Upon the occurrence of a crash incident involving crash impact to the case, the sensor mechanism will rapidly activate a high pressure gas or air and automatically inflate a structure, such as, but not limited to, air bag, to a specific configuration extending from at least one of a base and at least one side of the either the protective case or the mobile electronic device to envelop the back plane, front facing screen, and sides areas of the mobile phone, tablet, laptop device, etc. Thus, an increased chance of proactive reactive protection is realized.

More specifically, an inflatable protective barrier may be inflated in about 100 ms after activation based on detection by at least one sensor of an imminent contact with a unwanted surface. The at least one sensor may recognize an abnormal motion of a user caused by e.g. accidentally dropping. The inflatable protective barrier system may also comprise sensors preventing "false" inflation by accidental activation by cellular phones and other electronic equipment. The inflatable protective barrier may be folded and arranged inside the device encasement as an integrated part or as an attachment module along the back plane or longitudinal sides.

Figure 2:
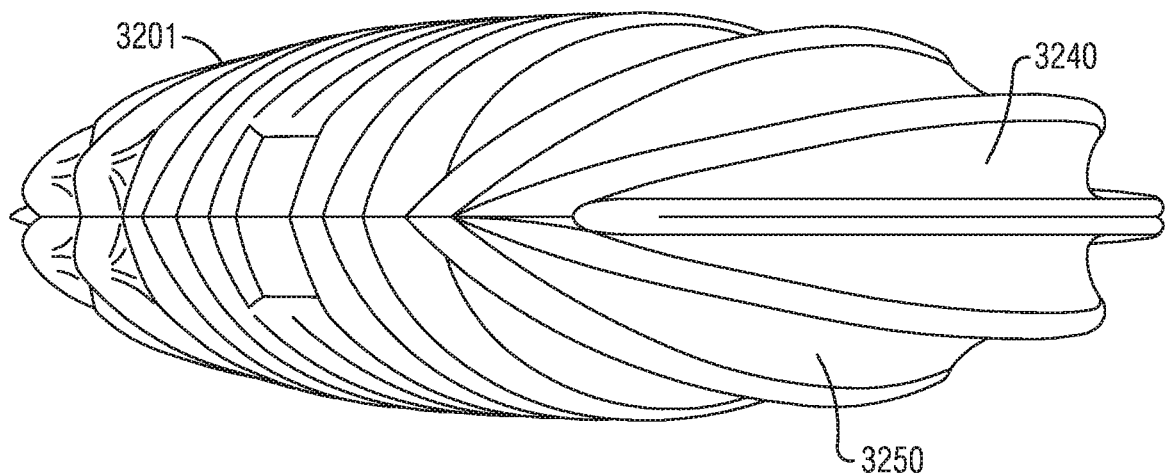
FIG. 2 shows an embodiment of the protective mobile device case fully deployed.

FIG. 1 shows an embodiment of a protective mobile device case partially deployed and FIG. 2 shows an embodiment of the protective mobile device case fully deployed. As shown, a mobile device 3210, such as, but not limited to a mobile phone, tablet, phablet, or laptop computer, is provided. A sensor 3220 is provided. As explained further herein, the sensor may be a fusion sensor. A deployable barrier, or pouch, 3201 or covering is provided. The pouch 3201, when activated is expanded around the mobile device 3210. As shown, the pouch 3201 may have a top member 3200 and a bottom member 3230.

In other embodiments, the pouch may not provide for complete enclosure of the mobile device, but provides for the cover 3201 to expand in parts to cover key areas of the mobile device. The pouch 3201 may activated by being at least one of a chemical mixture pouch, a pressurized gas, and an air inflatable protective encapsulation barrier. As is explained further herein, the pouch 3201 may be attached using adhesive substrate, an embedded part to the mobile device, an attachment slide or click component to the mobile device 3210, or to a protective cover 3400 attached to at least a part of the mobile device 3210. As further shown, when activated by the sensor 3220, the pouch is deployed.

More specifically, the deployable barrier may be either directly attached to the mobile device 3210 or by way of the protective cover 3400 that covers at least a part of the mobile device 3210. The protective cover 3400 may comprise an area to store or hold the deployable barrier 3201 prior to the barrier 3201 being deployed. In an embodiment, the stored deployable barrier 3201 is within a container 3440 that attaches to the protective cover 3400. When deployed, the container 3440 may be removed from the protective cover 3400 and a replacement protective cover 3400 with another packaged or stowed deployable barrier 3201 may be attached. In yet another embodiment, the deployed barrier 3201 may be folded back up and reinstalled.

Figure 3:
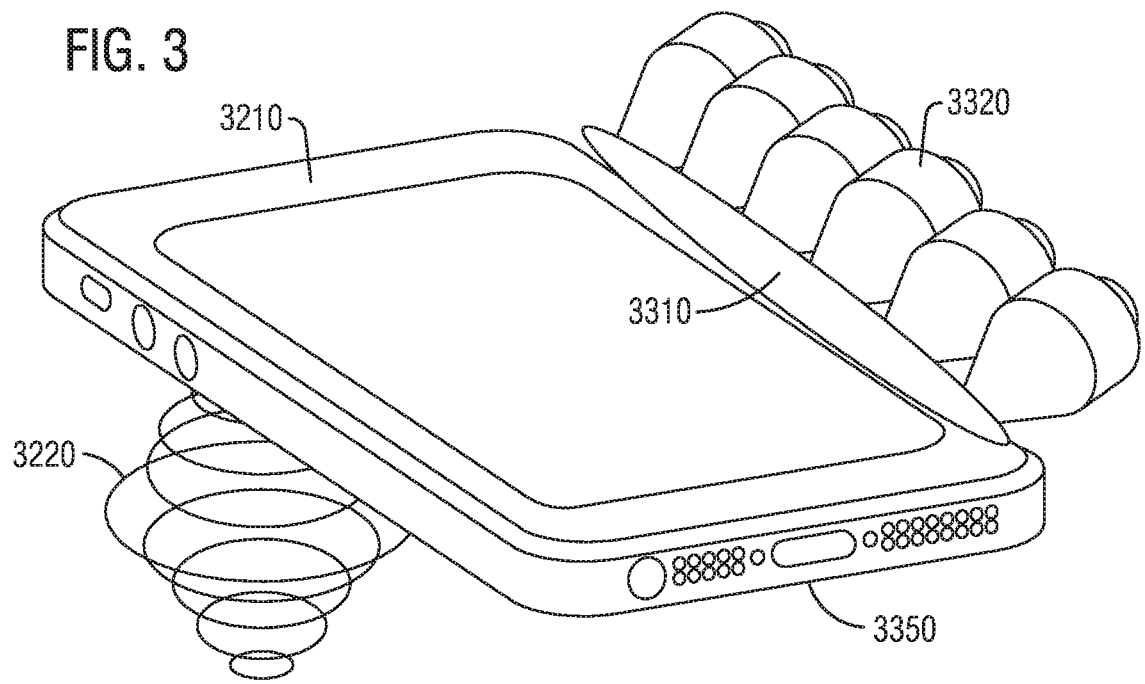
FIG. 3 shows another embodiment of a pouch arrangement deployed.

FIG. 3 shows another embodiment of a pouch arrangement deployed. As discussed above, the pouch may not have a traditional pouch arrangement. Thus, the term "pouch" is not meant to be limiting as it includes any expandable or inflatable element that function as a deflector, barrier, or bumper to protect the mobile device 3210. As shown, an inflatable protective barrier comprising a plurality of individual mini-barriers is provided. Though mini-barriers are disclosed, the barrier may be a single component. Though the barrier 3201 is shown only on a single side of the mobile device 3210, it may be provided on other sides of the mobile device 3210 as well. In embodiment, based on a direction of fall, as may be detected by the sensor 3220, the barrier 3201 may be deployed either to direct the surface that will hit the ground first or sequentially around the mobile device where the side that is expected to strike first is deployed first.

Figure 4:
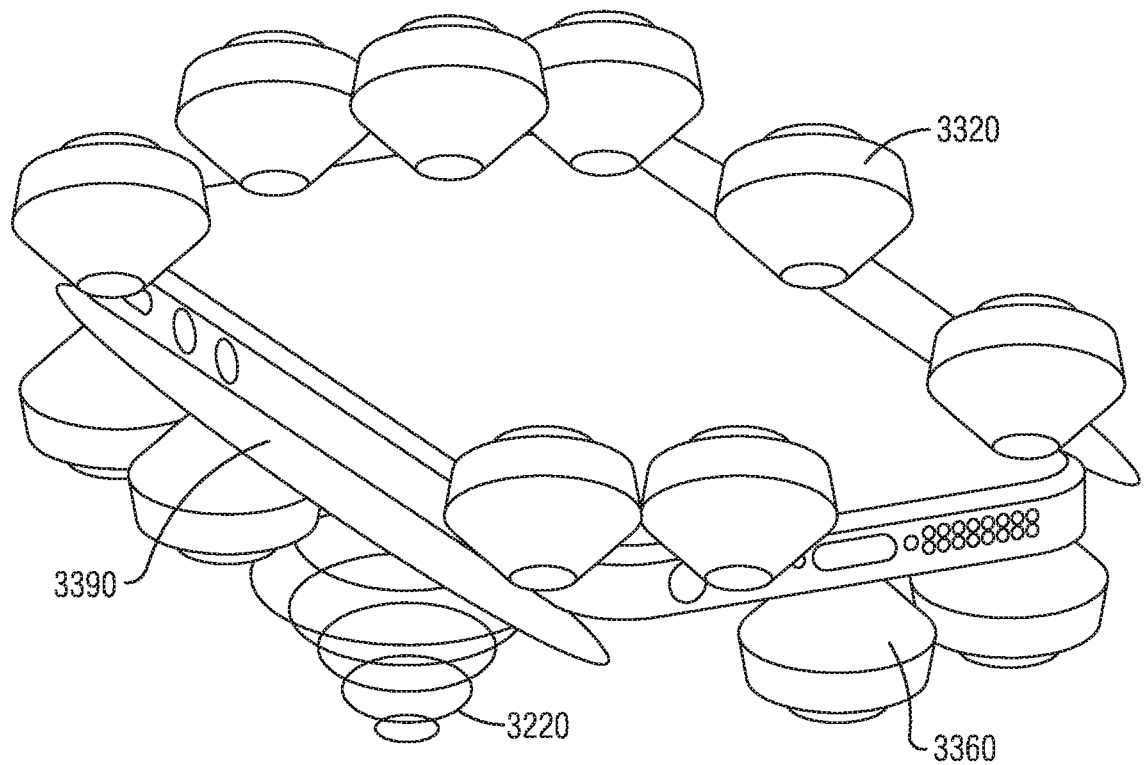
FIG. 4 shows another embodiment of the pouch arrangement deployed.
Figure 8:
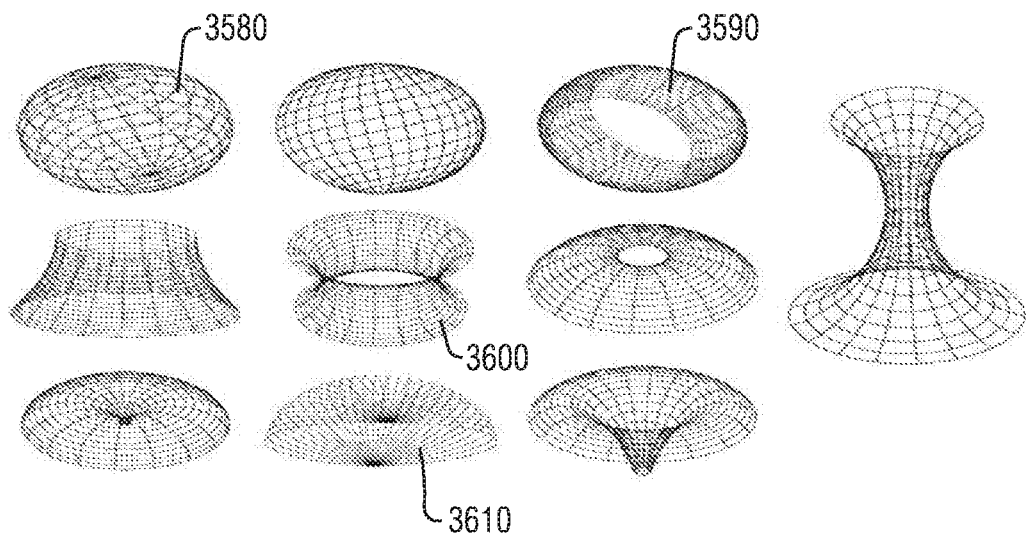

FIG. 4 shows another embodiment of the pouch arrangement deployed. As shown, mini-barriers 3320 may be provided around all sides of the mobile device 3210, including a top surface, a bottom surface, and a side surface of the mobile device 3210. As discussed above, the mini-barriers 3320 may be deployed in parallel or in series, depending on an anticipated location the mobile device will hit a ground surface first. The shapes of the mini-barriers 3320 may not be the same, as is shown when comparing the bottom surface mini-barriers to the side surface mini-barriers 3320.

FIGS. 5-8 show other embodiments of the pouch arrangement. These embodiments may be for a single pouch or a mini-barrier. Embodiments are not limited to just one geometric form for either the pouch or mini-barrier. As a non-limiting example, a plurality of different mini-barriers may be used to form a single collective barrier at a particular location on the mobile device. Furthermore, a shape of the pouch or barrier may be decided based a location where the mobile device is located. For example, the sensor may comprise a sensor that determines an elevation of the device with respect to a ground surface. Factoring in weight of the mobile device, a processor may determine a shape of at least one of the pouch, barrier or mini-barriers. As a non-limiting example, either the pouch, barrier or mini-barrier may comprise a cube shape. But if the sensor detects the mobile device is going to fall a greater distance than normal, additional cavities may be inflated to convert the cube shape to a truncated cube or cuboctahedron.

Figure 9:
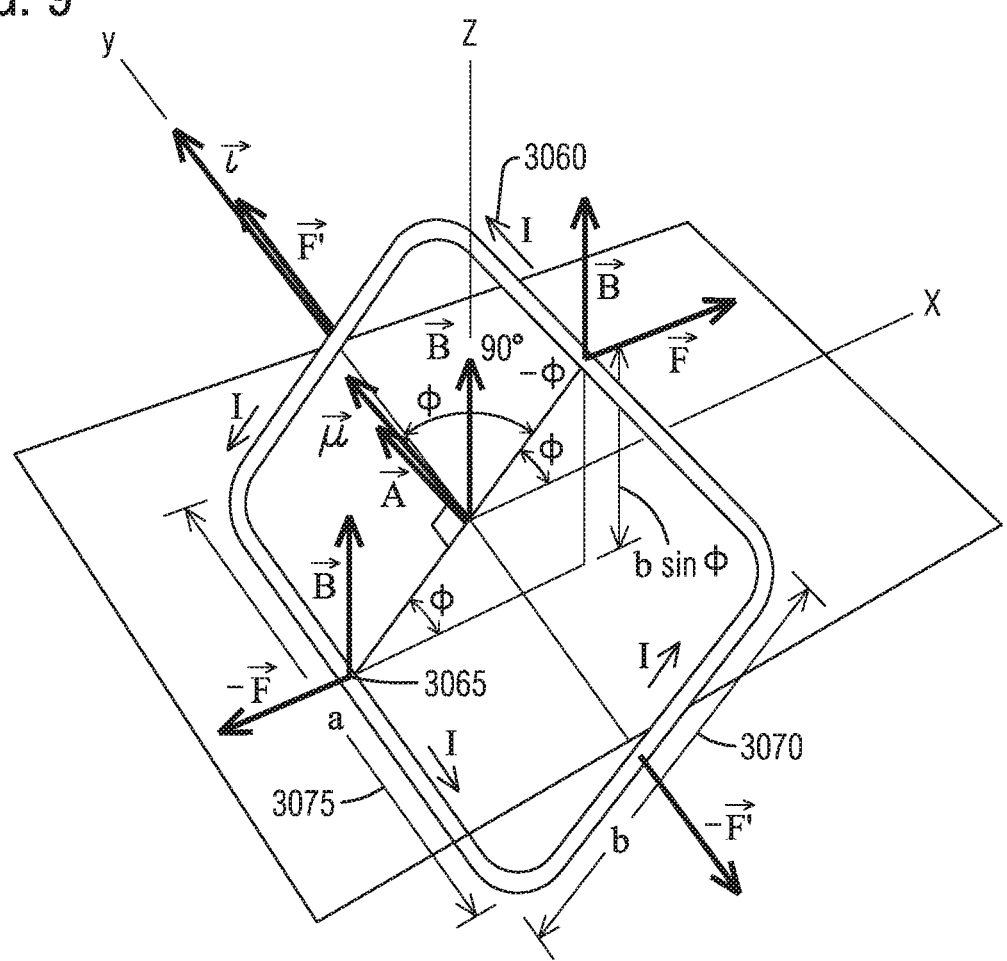
FIG. 9 is an image drawing showing how kinetic energy force and torque analysis I applicable to sensor detection.

FIG. 9 is an image drawing showing how kinetic energy {E k=12 mv2} force and torque analysis is constructive to the quantum mechanics probability for the embodiment of the mobile device within a protective case where the fusion sensor identifies potential impact along the elongated side edge angle and enables the electrical charge hardening to project a force field repelling of similar electrical charges and shock wave extrapolation paths before initiating the present inventions inflatable protective encapsulation barrier. $F'=IbB \sin(90°-\alpha)=IbB \cos \alpha$.

Figure 10:
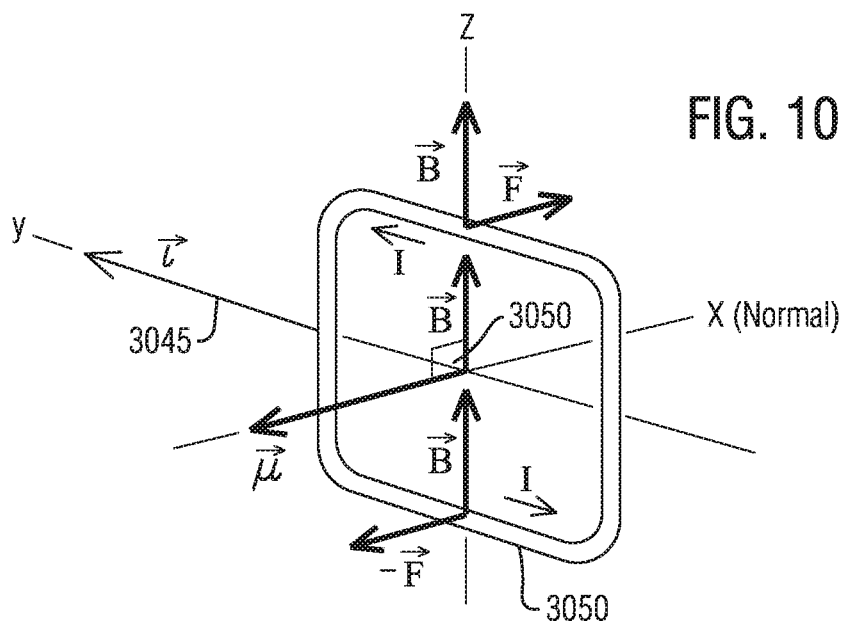
FIG. 10 is an image drawing showing an embodiment of the mobile device within a protective case.

FIG. 10 is an image drawing showing an embodiment of the mobile device within a protective case where the fusion sensor identifies potential impact along the end side edge angle and enables the electrical charge hardening to project a force field repelling of similar electrical charges and shock wave extrapolation paths before initiating the present inventions inflatable protective encapsulation barrier.

Figure 11:
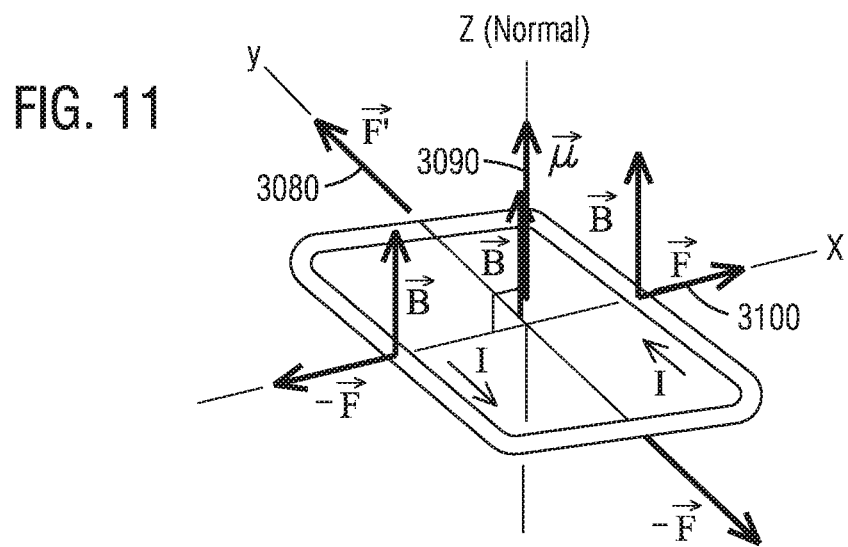
FIG. 11 is an image drawing showing another embodiment of the mobile device within a protective case.

FIG. 11 is an image drawing showing an embodiment of the mobile device within a protective case where the fusion sensor identifies potential impact along the flat front or back plane side and enables the electrical charge hardening to project a force field repelling of similar electrical charges and shock wave extrapolation paths before initiating the present inventions inflatable protective encapsulation barrier.

The embodiments shown in FIGS. 9-11 may be useful in activating deployment of the pouch, barrier or mini-barriers. The embodiments of FIGS. 9-11 may also be useful in a sequence of activation.

Figure 12:
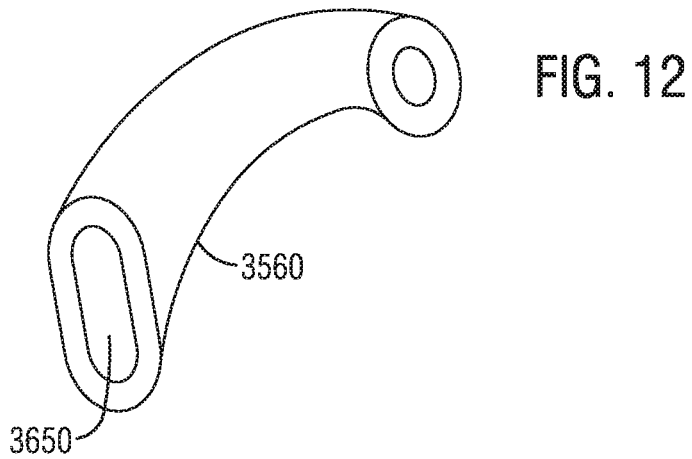
FIG. 12 shows an embodiment of a part of the inflatable protective barrier.

FIG. 12 shows an embodiment of a part of an embodiment of an inflatable protective barrier. The barrier 3201 may have a cavity into which a gas flows. In an embodiment, the protective barrier does not fully engulf the mobile device. Instead, as shown in FIG. 6, a straw or stick geometric enclosure surrounds the mobile device. Thus, the proactive barrier 3201 may comprises a plurality of expandable tubes into which gas is inserted to cause the tubes to expand to form the protective barrier.

Thus, as shown above, the inflatable protective barrier 3201 may not be readily visible until it is inflated. The inflatable protective barrier may comprise a variety of shapes that could be geometric, spherical, oblong, or vanity shapes representing an animal, sports mascot, or the like that surrounds the mobile phone, tablet, keyboard case combo, or laptop during the accident and cushions the device from shock or direct damage.

The inflatable protective barrier 3201 may be designed in many different manners and materials, and may not take more space than an ordinary protective case with a tuck-in, snap-on, slide-and-lock integrated or modulated attachment feature. Thus, a protective case may be provided with an inflatable protective barrier system for protecting the mobile device in case of an abnormal movement, e.g. during walking, cycling, running, standing, misstepping, or causing the phone case sensor to recognize an abnormal movement.

The inflatable protective barrier 3201 may be arranged around an encasement 3400 of the mobile device 3210 as an integrated part or as an attachment module along a back plane or longitudinal sides of the mobile device 3210, or may have parts attached directly to the mobile device 3210. A sealable opening, normally at the back facing plane of the device, may be provided. Alternatively, the opening may be arranged on the front facing longitudinal edges of the encasement lip or collar portion of the protective case.

Furthermore, the opening may be totally or partly dividable. The sealing may be a micro-Velcro© fastening, magnets, pressurized hardened shape, glue, tape, straps or the like. The protective case may be made of any kind of flexible material, such as acetate silk, jeans, fleece, cotton, beaver nylon or the like. The case encloses the inflatable protective barrier system, which comprises an inflatable protective barrier, an inflator or propellant pouch, and be one or several inflatable receptacles, depending on the design of the inflatable protective barrier. As non-limiting examples, the inflatable protective barrier may be a nylon, polyester, synthetic silk, biogenetic material, plant-based material, textile bag, rubberized, flexible plastic, mylar or the like.

The barrier 3201 may also be water resistant. Therefore, if the mobile device 3210 falls into a liquid and the barrier deploys in advance of the mobile device being submerged, the barrier may act as a flotation device or may insulate the mobile device from the liquid.

The inflatable protective barrier may be folded and packed into an upper portion of a collar on the cover or within the mobile device, for example in a pocket arranged therein. As a non-limiting example, the inflatable protective barrier 3201 may extend from the left front side, adjacent the opening, around the end point stopping close to the right front side, adjacent the sealed opening. The inflatable protective barrier may comprise one to many parts, depending on the finished shape of the inflatable protective barrier when inflated.

Figure 13:
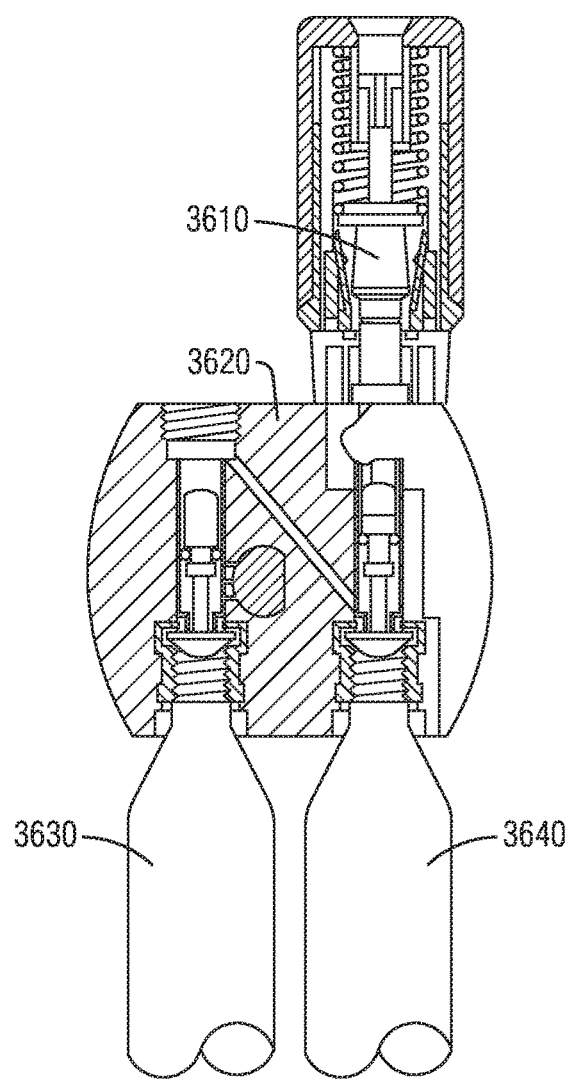
FIG. 13 is an image drawing showing an embodiment of a dual capsule of pressurized gas or air for used to initiate the inflatable protective encapsulation barrier.

The protective barrier 3201 may be released by an activation device that cause the inflatable protective barrier to deploy from its stored location to protect all or a specific section of the mobile device. FIG. 13 is an image drawing showing an embodiment of a dual capsule of pressurized gas or air for used to initiate the inflatable protective encapsulation barrier.

Figure 14:
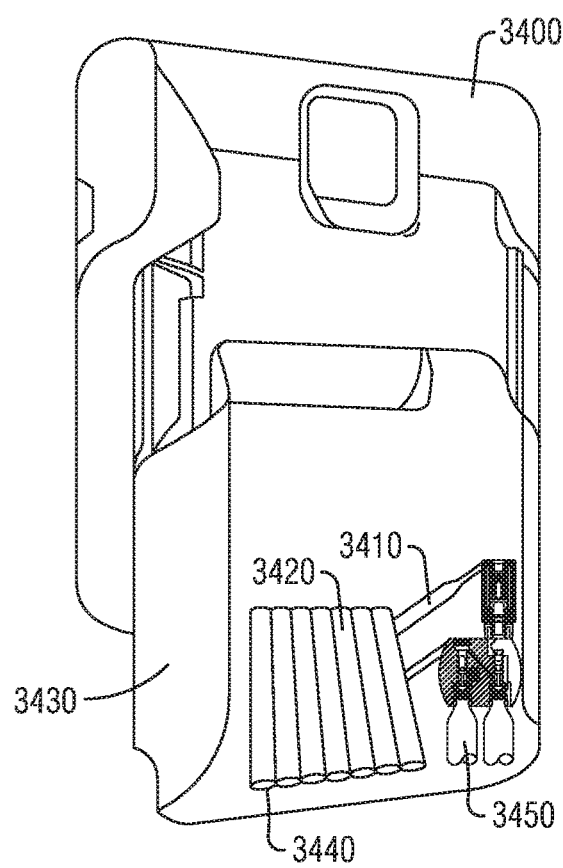
FIG. 14 is a back view image drawing showing an alternative embodiment of a dual capsule of pressurized gas or air and a pre-deployed inflatable barrier.
Figure 15:
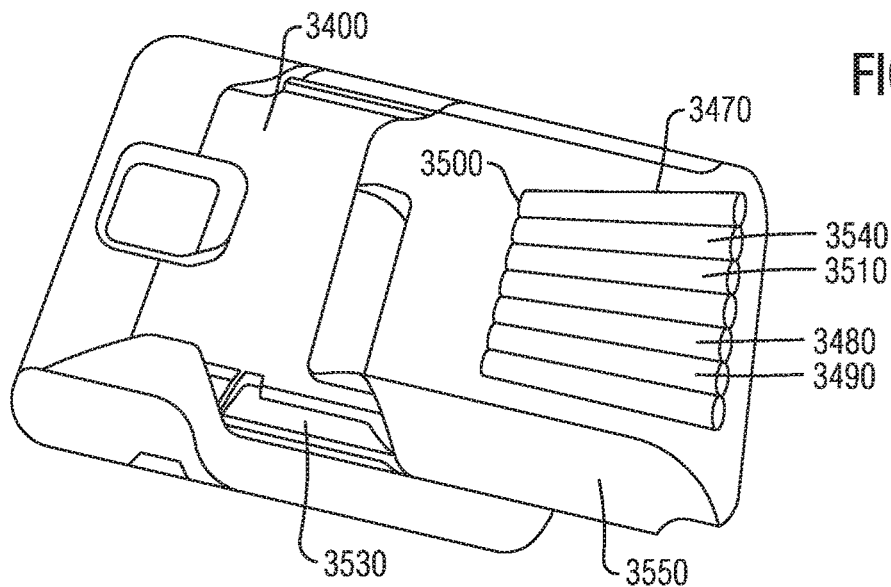
FIG. 15 shows another embodiment of the capsule and pre-deployed inflatable protective barrier, As shown, the barrier may comprise a pre-deployed arrangement of any arrangement.

FIG. 14 is a back view image drawing showing an alternative embodiment of a dual capsule of pressurized gas or air and a pre-deployed inflatable barrier. FIG. 15 is a back view image drawing showing another embodiment. As shown, the a compressed gas propellant is within a same chamber or location as the pre-deployed inflatable barrier.

Figure 16:
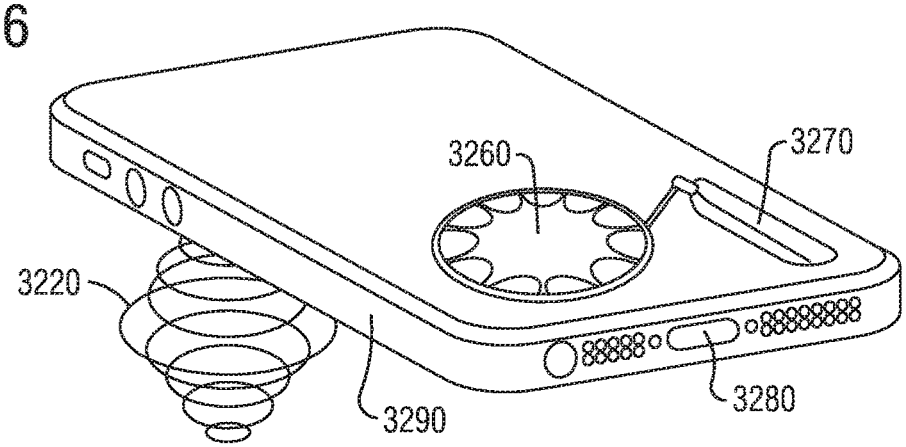
FIGS. 16-18 show other embodiments of FIG. 15.
Figure 17:
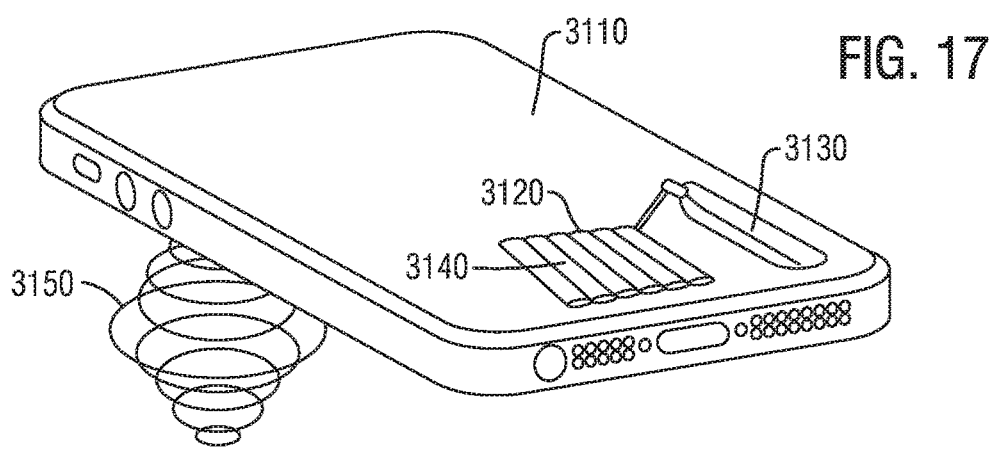
Figure 18:
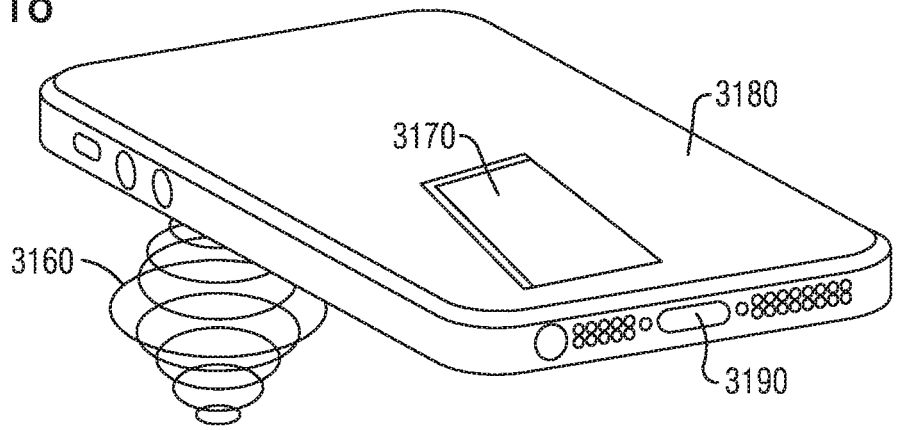

FIG. 15 shows another embodiment of the capsule and pre-deployed inflatable protective barrier, As shown, the barrier may comprise a pre-deployed arrangement of any arrangement. FIGS. 16-18 show other embodiments as disclosed further in the provisional patent application incorporated by reference in its entirety.

Thus, the inflator may be located within the housing of the integrated or on an attachment module along the back or longitudinal side of the protective case. It is connected to the inflatable protective barrier. The inflator may be a hybrid generator such as a canister, which is filled with gas or air. The hybrid generator has no powder, which results in less heat release and a minor pop/bang when the inflatable protective barrier is inflated. Alternatively, a sound compressor or dampener may be used to minimize a sound associated with the inflator device or propellant pouch expelling the gaseous or air contents into the inflatable protective barrier. The inflator may be smaller than most presently available inflators with the inflation volume quantity depending on a size or shape of the inflatable protective barrier.

Alternatively, the inflator may be a pyro technic inflatable protective barrier pouch inflator, which uses hot gases formed by powder, a cold gas inflator, a hybrid inflator or a heated gas inflator. The inflator may include a deflator, for directing the gas into the inflatable protective barrier. The inflator may be screwed, glued, snapped, slide, sewed or the like onto the protective inflatable protective barrier apparatus. The deflator may be positioned inside the inflatable protective barrier system for directing the gas into the bag for inflating the inflatable protective barrier in a proper manner.

The deflator may be T-shaped for being able to lead the gas into the inflatable protective barrier in a suitable way. Alternatively, the deflator may be Y-shaped, I-shaped, arrow-shaped, multiple part shaped cylindrical shaped or the like. The inflator may be ergonomically shaped to fit comfortably at the back of the user's device. It may have a rounded shape, optimized for its position and function. During inflation, the downward recoiling force of the inflator is counteracted by an upward force, which is absorbed by the strong fabric of the textile bag. The inflator may use a battery, as a non-limiting example with 3 Volt, which may be located in the receptacles. The battery may be 20 a rechargeable battery, which is recharged by electrical or kinetic energy or a disposable battery, such as a watch battery. An indicator, which indicates whether the inner elements of the helmet is intact or not and if the battery is charged or not, is arranged in connection with the electronics. The indicator may be a light emitting diode (LED), which indicates with a light signal if the battery is charged or not or if any of the inner parts are broken. The indicator may also be a sound signal, such as a buzz, a vibrating signal or a smelling signal, which indicates when the battery is almost discharged or if 30 any of the inner parts are broken.

Figure 19:
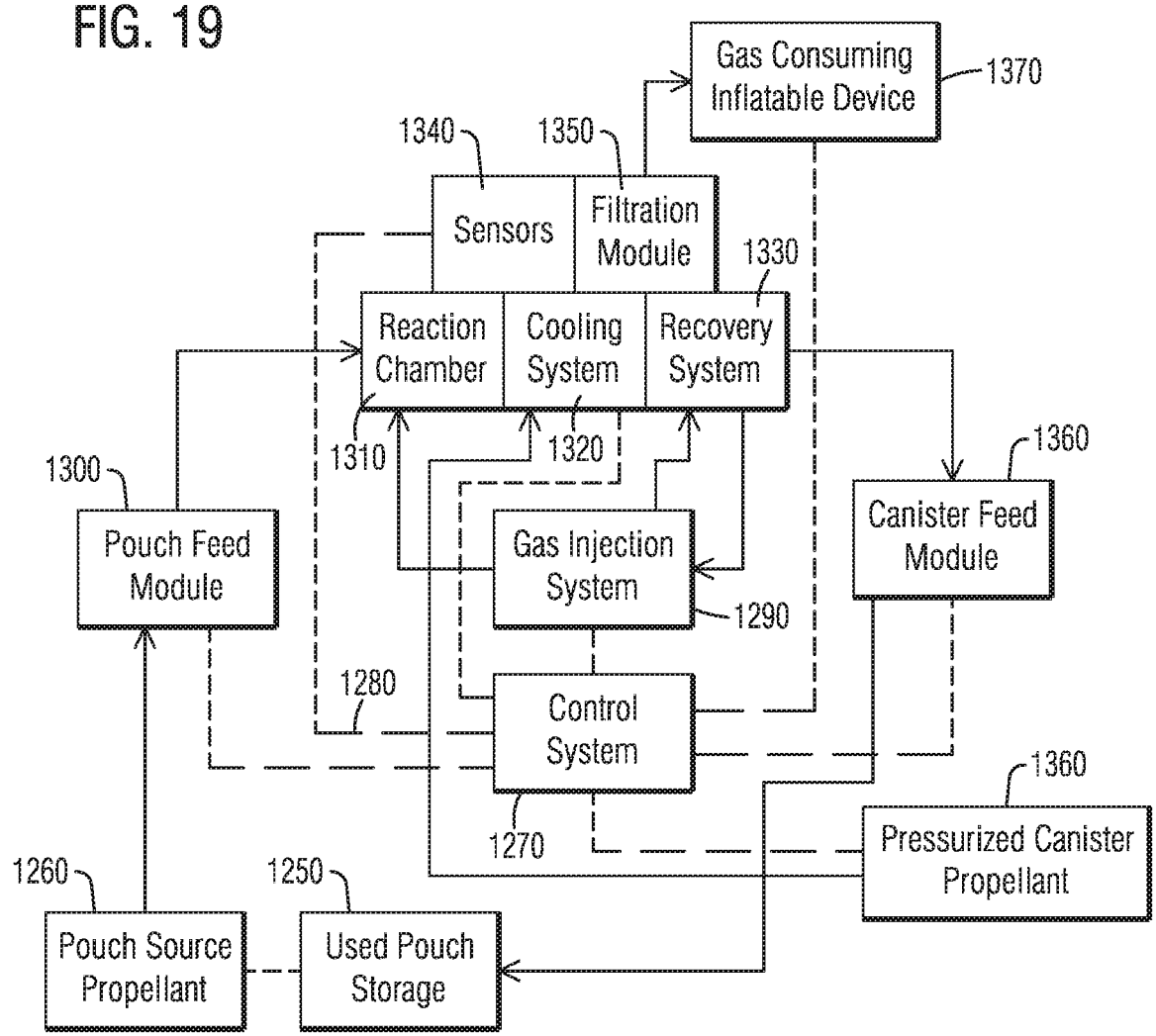
FIG. 19 shows a block diagram showing an embodiment of a gas propellant capsule.

FIG. 19 shows a block diagram showing an embodiment of a gas propellant capsule or pouch or pressurized canister inflatable sensory. As shown, A controller is provided to control the subsystems to cause the gas release to deploy the deployable barrier. A recovery system is disclosed which may be used to recharge the embodiment once used. In another embodiment, the system may be removed and replaced with a replacement subsystem.

Figure 20:
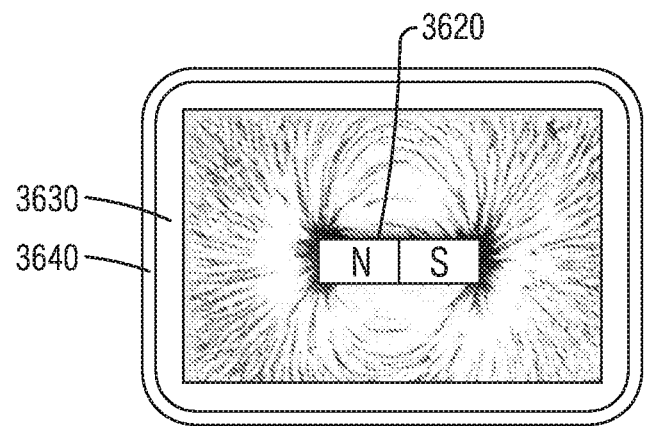
FIG. 20 is an image drawing showing an embodiment of an electric charge that can have charge transference.

In another embodiment, a hardened invisible barrier screen protector may be create. FIG. 20 is an image drawing showing an embodiment of an electric charge that can have charge transference to enable repelling of like charged objects creating a hardened invisible barrier screen protector.

Figure 21:
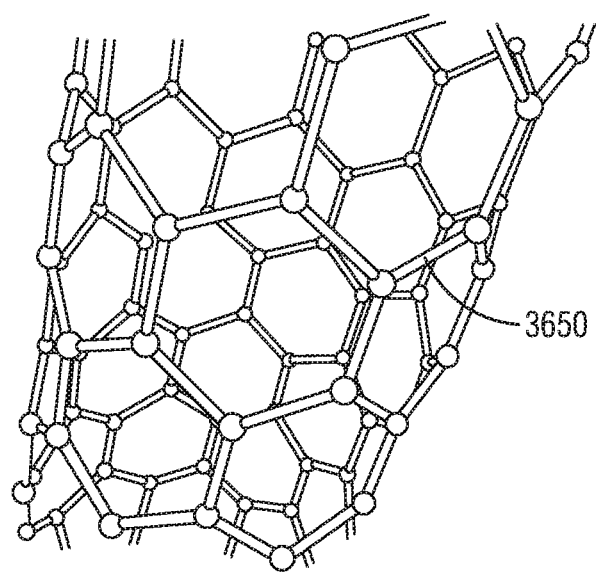
FIG. 21 is an image drawing showing an embodiment nanotubes or nanowires that enable the electric charge that can have charge transference.

FIG. 21 is an image drawing showing an embodiment nanotubes or nanowires that enable the electric charge that can have charge transference to enable repelling of like charged objects creating a hardened invisible barrier screen protector. The nanotubes may be within a monitor or screen of the mobile device. The nanotubes or nanowires connectors that enable the electric charge that can have charge transference to enable repelling of like charged objects creating a hardened invisible barrier screen protector. The inline nanotubes or nanowires connectors that enable the electric charge that can have charge transference to enable repelling of like charged objects creating a hardened invisible barrier screen protector. In other non-limiting embodiments, the shield may be created with the use of at least one of an energy field of electro-magnetic, sound resonance, laser, forced air, or magnetic levitational technology.

Figure 22:
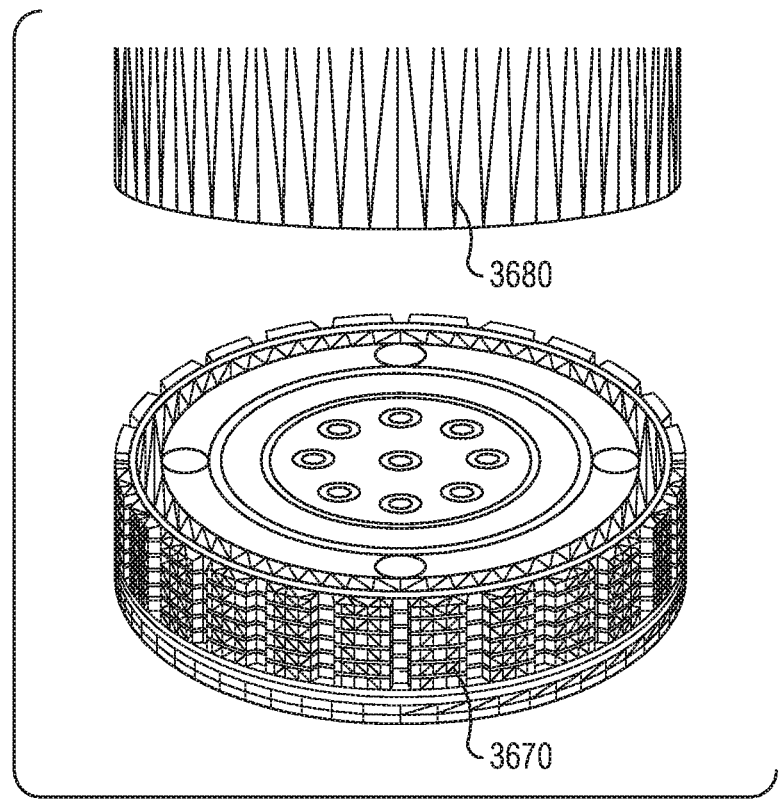
FIG. 22 is an image drawing showing an embodiment of nanotubes or nanowires connectors.

FIG. 22 is an image drawing showing an embodiment of nanotubes or nanowires connectors from a side view that enable an electric charge that can have charge transference to enable repelling of like charged objects creating a hardened invisible barrier. Whereas, FIG. 21 shows the nanowire connectors from a perspective view. As shown, the poles are marked.

Figure 23:
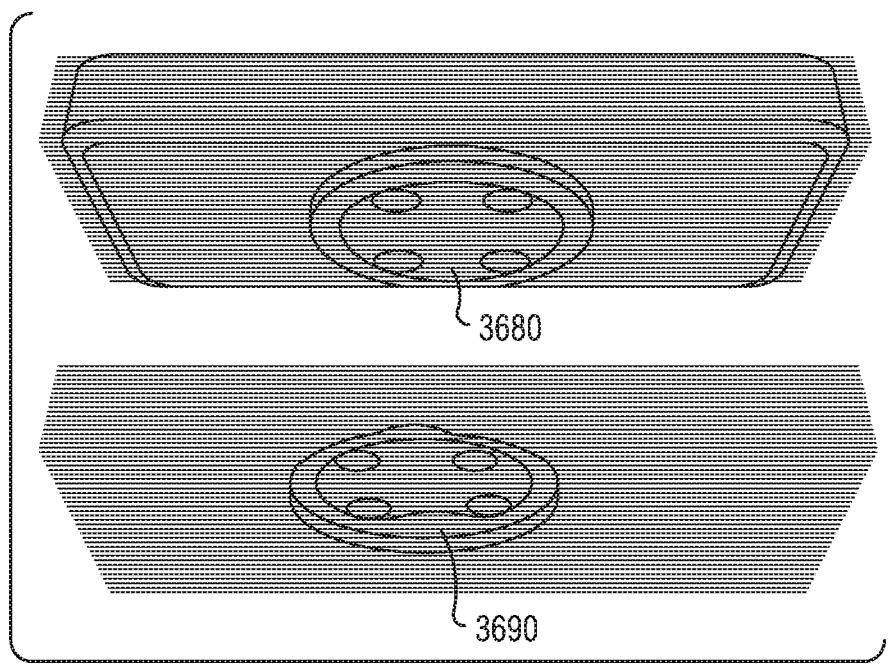
FIG. 23 is an image drawing showing an embodiment of inline nanotubes or nanowires connectors from a bottom view.
Figure 24:
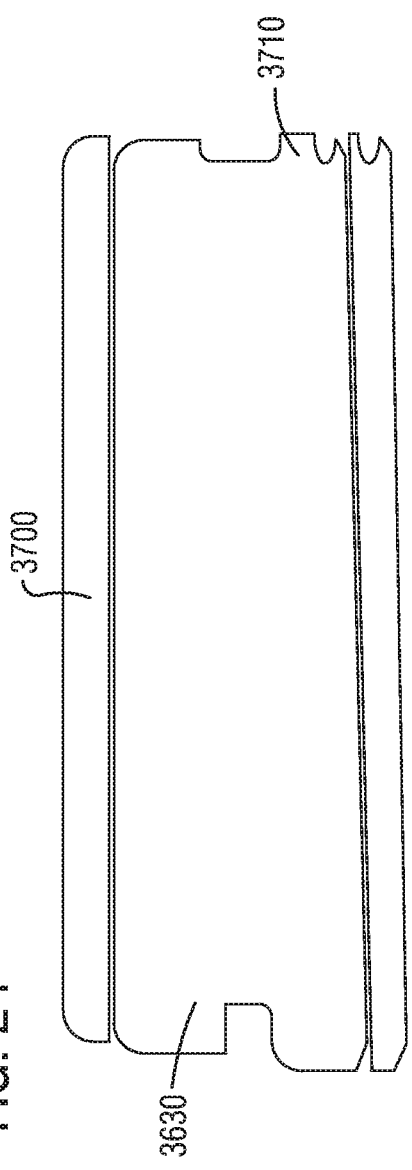
FIG. 24 is an image drawing showing an embodiment of the screen protector from a top view.

FIG. 23 is an image drawing showing an embodiment of inline nanotubes or nanowires connectors from a bottom view that enable the electric charge that can have charge transference to enable repelling of like charged objects creating a hardened invisible barrier screen protector. FIG. 24 is an image drawing showing an embodiment of the screen protector from a top view with nanotubes or nanowires connectors that enable the electric charge that can have charge transference to enable repelling of like charged objects creating a hardened invisible barrier.

The sensor 3220 to detect abnormal movement, such as the mobile device falling may be a combination of different sensors, hence the term fusion sensor. Non-limiting examples of the fusion sensor may comprise a pressure impact sensor, a proximity sensor, a gyroscope or gyro meter, an accelerometer, a moisture detection sensor, etc. or like mechanism to be incorporated into the structure of a cover, or attachment point, to which an embodiment disclosed herein is attached to.

Figure 26:
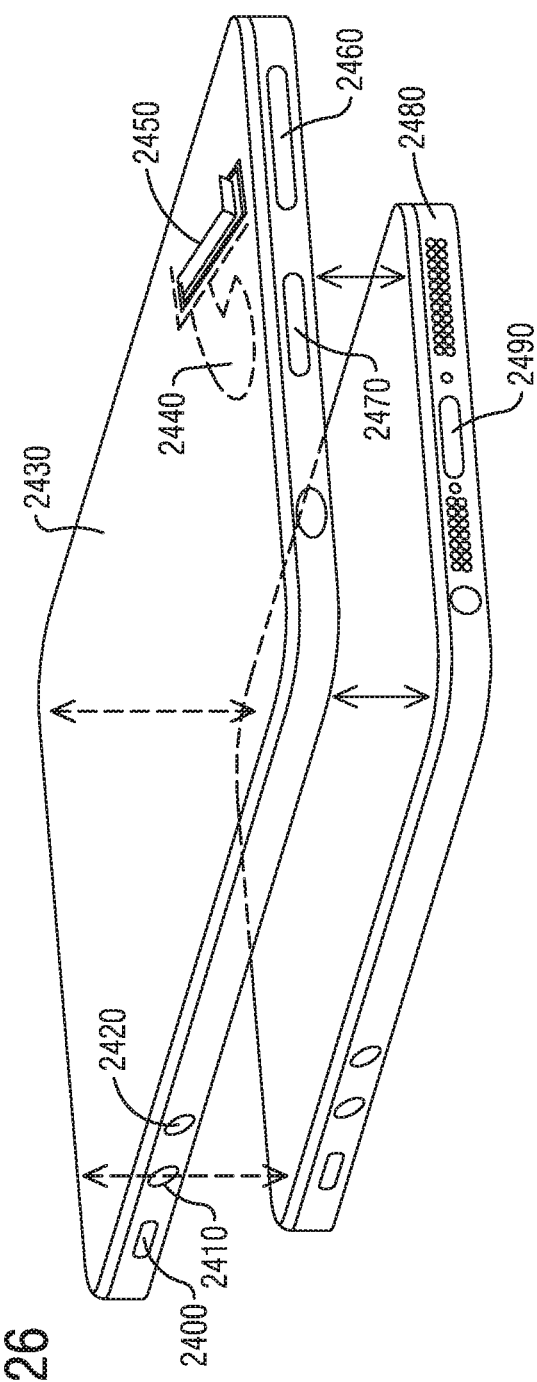
FIG. 26 shows an embodiment where the protective case has an expandable memory location.
Figure 25:
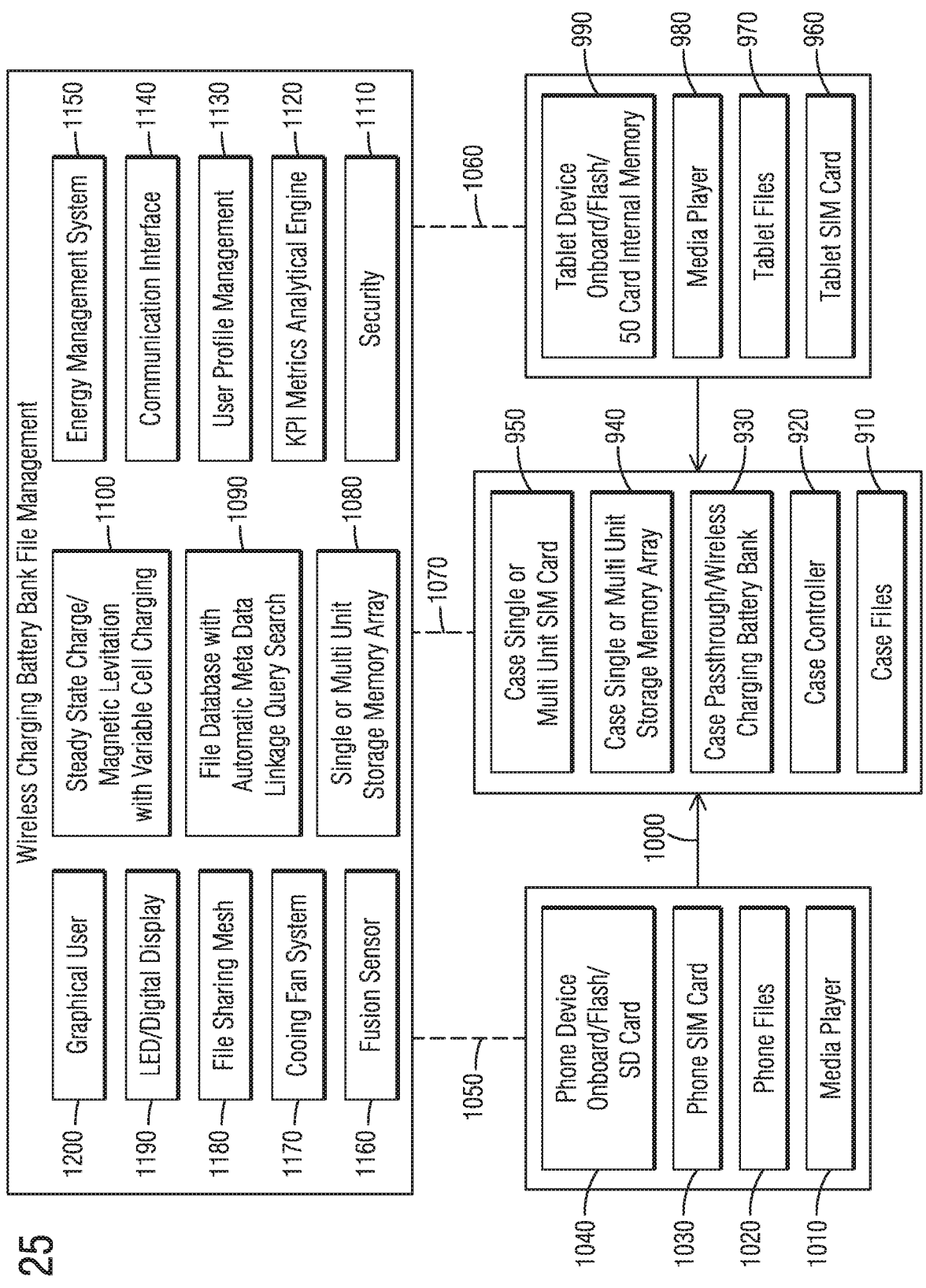
FIG. 25 shows an embodiment of a wireless charging battery bank file management device.

The cover to which the barrier is attached may comprise a plurality of auxiliary components to further enhance operation of the mobile device. As a non-limiting example, an auxiliary battery may be part of the cover that is attached to the mobile device. The battery may be a wireless charging battery bank file management device, as illustrated in FIG. 25. As shown, plurality of components may be included to provide for wirelessly charging a battery that is primarily used by the mobile device. An external memory device, such as, but not limited to, a SIM card may also be attached to the cover to provide the mobile device additional memory storage capabilities. A plurality of SIM cards may be attached. In another embodiment, a selector may be provided to select which SIM card to use at a given time. The use of SIM card is used to represent any memory device. FIG. 26 shows an embodiment where the protective case has an expandable memory location. 2450.

Figure 27:
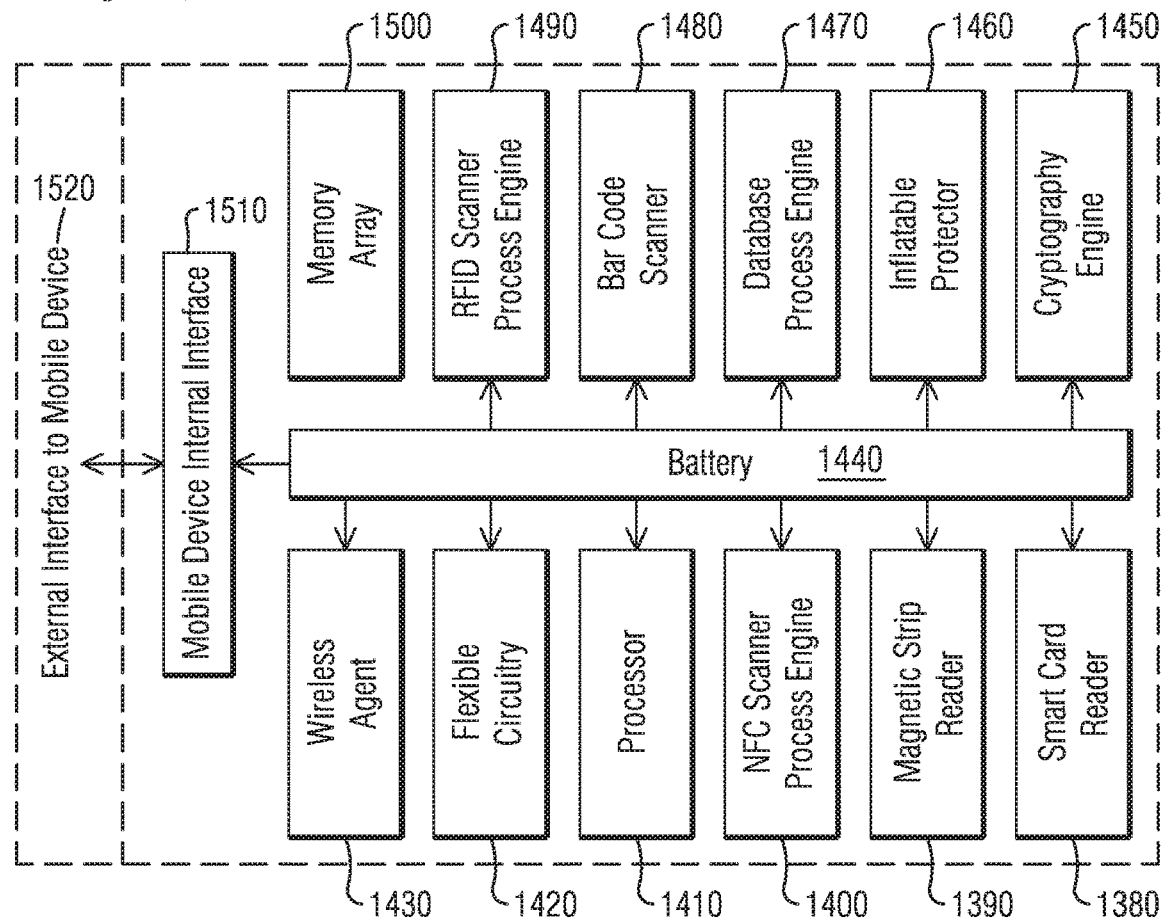
FIG. 27 shows a block diagram illustrating an embodiment of external components that may be attached to the cover.

FIG. 27 shows a block diagram illustrating an embodiment of external components that may be attached to the cover and used by the mobile device. Such external components comprises, but are not limited to, supplemental battery or power source, as discussed above, SIM Card or memory device. As shown, there is an external interface 1520 to the mobile device. The battery or power source may also provide power to the sensor, processor and activation device disclosed herein. Other components disclosed include a NFC scanner, a magnetic strip card reader, a smart card reader, RFID scanner, a bar code scanner, a cryptography engine. These are only representative components as others may be included as well. Furthermore, either fewer or more components disclosed may be use.

FIGS. 28 and 29 show other embodiments of components that may be included to enhance the mobile device. As shown in FIG. 28, the protective case may comprise a wire battery bank, the fusion sensor, and a multiple memory storage device center, such as, but not limited to a carousel changer tray.

As shown, in FIG. 29, the protective cover may comprise a wireless battery bank, the fusion sensor, a liquid sealed device for power and a data pass through port, a dual flat multi memory storage area. A cooling device, such as, but not limited to a mini fan, may also be included. Though these elements are shown primarily with respect to a smartphone, similar elements are applicable to other mobile devices, including, but not limited to a laptop computer.

Figure 30:
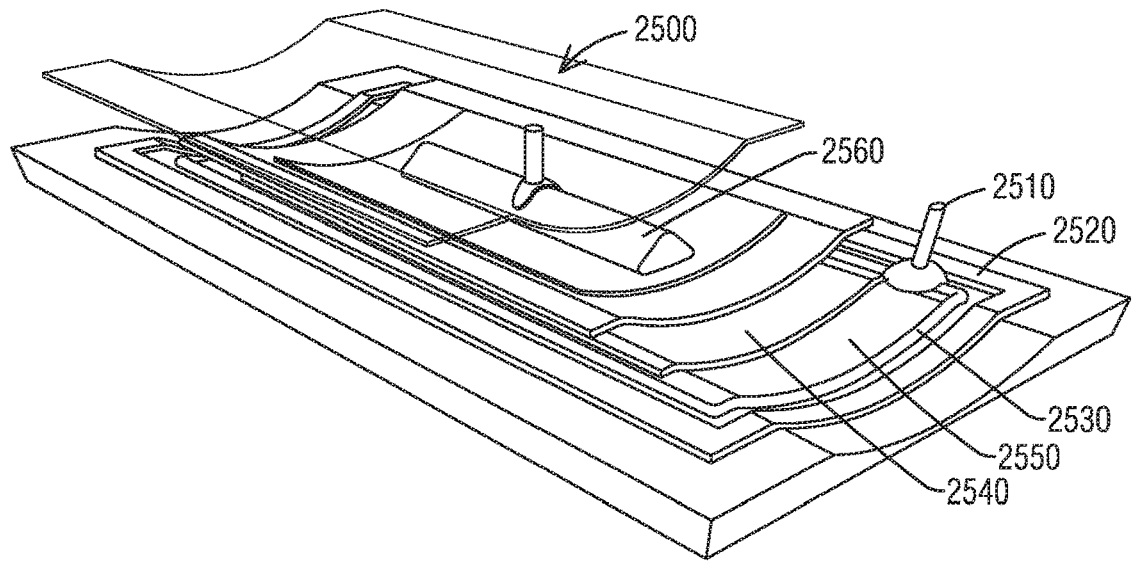
FIG. 30 shows layers of the protective cover.

FIG. 30 shows layers of the protective cover. The protective cover may comprise multi layers, that may be adhered together to provide for at least one of heat and shock wave absorption. The exposed layer may also comprise a non-harmful connection to ensure that the mobile device is held into place.

In an embodiment, external ports, such as, but not limited to data ports, headphone jacks may include an insertion cover of the protective cover to ensure that they are watertight.

Thus, embodiments relates to reducing damage to a mobile device if it is dropped. The embodiments disclosed herein include, in an embodiment, an inflatable device for automatic inflation of an air bag with high pressure gas or air or propellant pouch and ejects from the protective case embodiment the air bag to envelop the mobile phone, tablet or laptop device body for protection upon occurrence of a sensor driven crash accident upon abnormal movement of a user's handling of the electronic device to automatically protect the device from crash impact, liquid intrusion or physical damage due to user mishandling As will be disclosed herein, a protective enclosure for an electronic device such as, but not limited to, a laptop computer or tablet computer, a smart phone, that comprises a shell that is capable of enclosing and substantially surrounding the electronic device is shown. The shell is substantially watertight, substantially rigid and substantially crush-resistant. The inside of the shell has a hook and loop liner with shock absorbing corner bumpers having hook and loop type bases so that the bumpers may attach at any point on the liner inside the shell to accommodate electronic devices of various sizes and to secure the device inside the enclosure in a shock absorbent suspended manner. The shell may further comprise a USB connector hub for connection to the USB port of a laptop computer or PC tablet enclosed in the protective shell.

FIG. 31 discloses a method. The method 4300 comprises detecting, with a sensor, an unexpected change in at least one of velocity, acceleration and moisture of a mobile device, at 4310. The method 4300 further comprises deploying, with an activation device, a deployable barrier, stored to a cover that is attached to at least a part of the mobile cover, to protect the mobile device from damage, at 4320. The method 4300 may further comprise detecting when to deploy the deployable barrier with a processor in communication with the sensor, at 4330.

Figure 32:
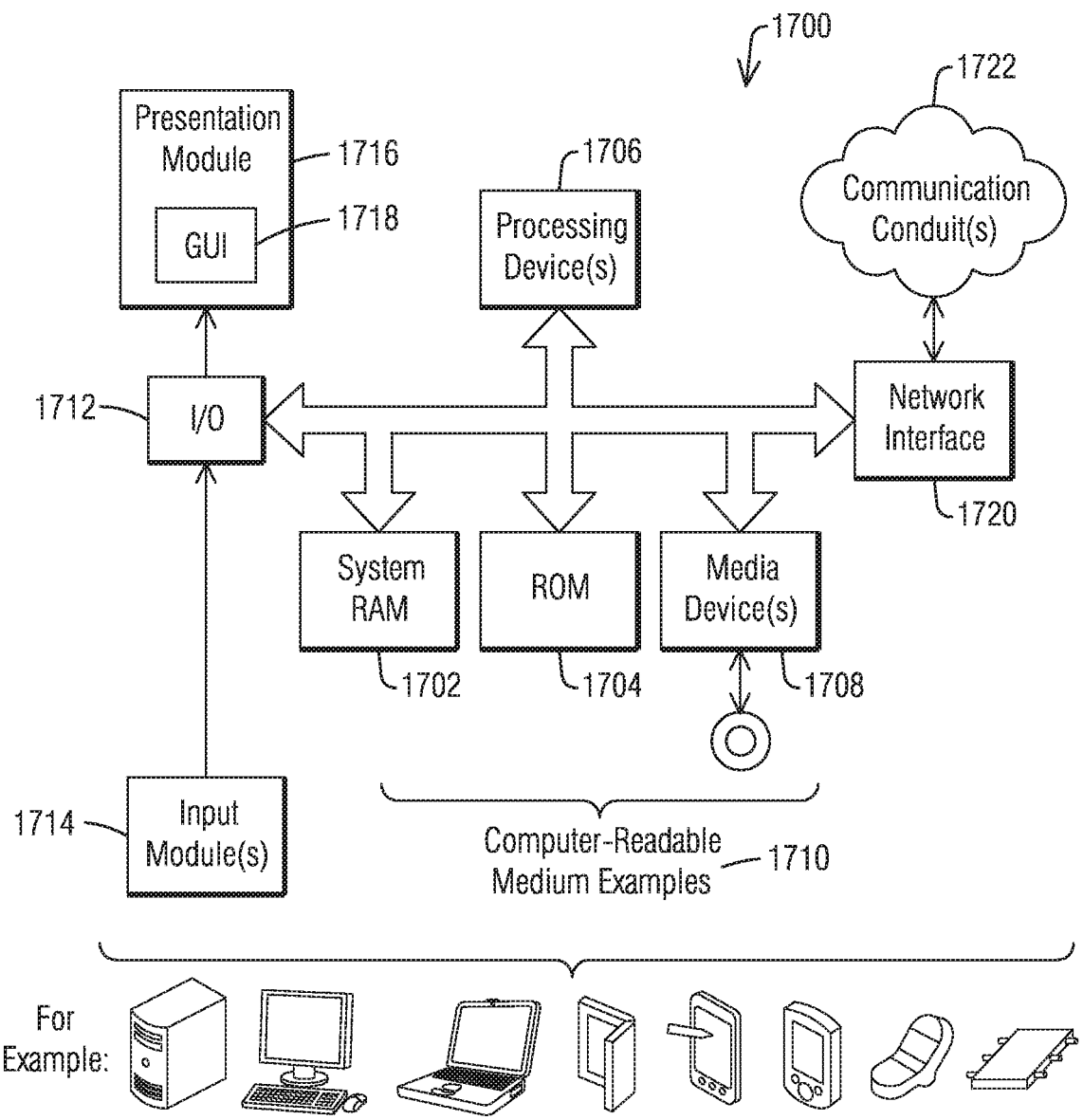
FIG. 32 shows a flowchart illustrating an embodiment of a method.

FIG. 32 sets forth an illustrative computing functionality 1700 that may be used to components, such as the processor disclosed above. In all cases, computing functionality 1700 represents one or more physical and tangible processing mechanisms. The computing functionality 1700 may comprise volatile and non-volatile memory, such as random access memory (RAM) 1702 and read only memory ("ROM") 1704, as well as one or more processing devices 1706 (e.g., one or more central processing units (CPUs), one or more graphical processing units (Gus), and the like). The computing functionality 1700 also optionally comprises various media devices 1708, such as a hard disk module, an optical disk module, and so forth. The computing functionality 1700 may perform various operations identified above when the processing device(s) 1706 execute(s) instructions that are maintained by memory (e.g., RAM 1702, ROM 1704, and the like).

Instructions and other information may be stored on any computer readable medium 1710, including, but not limited to, static memory storage devices, magnetic storage devices, and optical storage devices. The term "computer readable medium" also encompasses plural storage devices. In all cases, computer readable medium 1710 represents some form of physical and tangible entity. By way of example, and not limitation, the computer readable medium 1210 may comprise "computer storage media" and "communications media."

"Computer storage media" comprises volatile and nonvolatile, removable and non-removable media implemented in any method or technology for storage of information, such as computer readable instructions, data structures, program modules, or other data. The computer storage media may be, for example, and not limitation, RAM 1702, ROM 1704, EPSOM, Flash memory, or other memory technology, CD-ROM, digital versatile disks (DVD), or other optical storage, magnetic cassettes, magnetic tape, magnetic disk storage, or other magnetic storage devices, or any other medium which can be used to store the desired information and which can be accessed by a computer.

"Communication media" typically comprise computer readable instructions, data structures, program modules, or other data in a modulated data signal, such as carrier wave or other transport mechanism. The communication media may also comprise any information delivery media. The term "modulated data signal" means a signal that has one or more of its characteristics set or changed in such a manner as to encode information in the signal. By way of example, and not limitation, communication media comprises wired media such as a wired network or direct-wired connection, and wireless media such as acoustic, FRO, infrared, and other wireless media. Combinations of any of the above are also included within the scope of computer readable medium.

The computing functionality 1700 may also comprise an input/output module 1712 for receiving various inputs (via input modules 1714), and for providing various outputs (via one or more output modules). One particular output module mechanism may be a presentation module 1716 and an associated graphic user interface ("GUI") 1718. The computing functionality 1700 may also include one or more network interfaces 1720 for exchanging data with other devices via one or more communication conduits 1722. In some embodiments, one or more communication buses 1724 communicatively couple the above-described components together.

The communication conduit(s) 1722 may be implemented in any manner (e.g., by a local area network, a wide area network (e.g., the Internet), and the like, or any combination thereof). The communication conduit(s) 1722 may include any combination of hardwired links, wireless links, routers, gateway functionality, name servers, and the like, governed by any protocol or combination of protocols.

Alternatively, or in addition, any of the functions described herein may be performed, at least in part, by one or more hardware logic components. For example, without limitation, illustrative types of hardware logic components that may be used include Field-programmable Gate Arrays (Fogs), Application-specific Integrated Circuits (Asics), Application-specific Standard Products (Asps), System-on-a-chip systems (Sacs), Complex Programmable Logic Devices (Colds), and the like.

The terms "module" and "component" as used herein generally represent software, firmware, hardware, or combinations thereof. In the case of a software implementation, the module or component represents program code that performs specified tasks when executed on a processor. The program code may be stored in one or more computer readable memory devices, otherwise known as non-transitory devices. The features of the embodiments described herein are platform-independent, meaning that the techniques can be implemented on a variety of commercial computing platforms having a variety of processors (e.g., set-top box, desktop, laptop, notebook, tablet computer, personal digital assistant (PDA), mobile telephone, smart telephone, gaming console, wearable device, an Internet-of-Things device, and the like).

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising." Moreover, unless specifically stated, any use of the terms first, second, etc., does not denote any order or importance, but rather the terms first, second, etc., are used to distinguish one element from another.

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While various disclosed embodiments have been described above, it should be understood that they have been presented by way of example only, and not limitation. Numerous changes, omissions and/or additions to the subject matter disclosed herein can be made in accordance with the embodiments disclosed herein without departing from the spirit or scope of the embodiments. Also, equivalents may be substituted for elements thereof without departing from the spirit and scope of the embodiments. In addition, while a particular feature may have been disclosed with respect to only one of several implementations, such feature may be combined with one or more other features of the other implementations as may be desired and advantageous for any given or particular application. Furthermore, many modifications may be made to adapt a particular situation or material to the teachings of the embodiments without departing from the scope thereof.

Further, the purpose of the foregoing Abstract is to enable the U.S. Patent and Trademark Office and the public generally and especially the scientists, engineers and practitioners in the relevant art(s) who are not familiar with patent or legal terms or phraseology, to determine quickly from a cursory inspection the nature and essence of this technical disclosure. The Abstract is not intended to be limiting as to the scope of the present disclosure in any way.

Therefore, the breadth and scope of the subject matter provided herein should not be limited by any of the above explicitly described embodiments. Rather, the scope of the embodiments should be defined in accordance with the following claims and their equivalents.

I claim:

1. A method comprising:
   providing a protective case configured to be attached to a mobile electronic device, the protective case housing a deployable barrier, a sensor to detect when to deploy the barrier and an activation device to deploy the barrier, wherein the deployable barrier is stored within the case until deployed from the case;
   detecting, with the sensor, an unexpected change in at least one of velocity, acceleration and moisture of the mobile electronic device; and deploying the deployable barrier to form an encapsulation barrier to enclose the mobile electronic device in response to when the sensor detecting that the mobile device experienced an unexpected change in at least one of velocity, acceleration and moisture.

2. The method according to claim 1, wherein the deployable barrier is a water-resistant inflatable deployable barrier.

3. The method according to claim 2, wherein the activation device comprises a pressurized gas capsule; and further comprising activating the activation device to release a gas stored in the pressurized gas capsule to inflate the inflatable deployable barrier.

4. The method according to claim 1, wherein the encapsulation barrier is a flotation device adapted to insulate the mobile electronic device from liquid; and further comprising insulating the mobile electronic device by the encapsulation barrier from the liquid.

5. The method according to claim 1, wherein the sensor comprises at least one of a pressure impact sensor, a proximity sensor, a gyroscope, an accelerometer, and a moisture detection sensor.

6. The method according to claim 1, further comprising analyzing, by a processor, data from the sensor to determine a time to deploy the deployable barrier.

7. The method according to claim 1, wherein the deployable barrier comprises at least one of nanotubes and nanowires and the mobile electronic device comprises a screen; and the deploying further comprises:
    causing, by the activation device, the deployable barrier to deploy to provide protection to the screen of the mobile electronic device via the at least one of nanotubes and nanowires.

8. The method according to claim 7, further comprising electrically charging, by the activation device, the at least one of nanotubes and nanowires to create a hardened invisible screen protector barrier by charge transference.

9. A method comprising:
    protecting a mobile electronic device with a deployable barrier in response to when the mobile device experiences an unexpected change in at least one of velocity, acceleration and moisture wherein the deployable barrier comprises at least one of nanotubes and nanowires;
    detecting, by a sensor, when the mobile electronic device experiences the unexpected change in the at least one of velocity, acceleration, and moisture; and
    causing, by an activation device, the deployable barrier to deploy to provide protection to a screen of the mobile electronic device wherein the at least one of nanotubes and nanowires, when electrically charged, creates a hardened invisible screen protector barrier by charge transference.

10. The method according to claim 9, further comprising protecting the mobile electronic device with a deployable barrier that includes protecting the mobile device with an inflatable deployable barrier.

11. The method according to claim 10, wherein the activation device comprises a pressurized gas capsule; and further comprising activating the activation device to release a gas in the pressurized gas capsule to inflate the inflatable deployable barrier.

12. The method according to claim 9, further comprising creating, by the activation device, at least one of an energy field, sound resonance, laser, forced air, and electro-magnetic field that passes through the at least one of nanotubes and nanowires to create forces that extend from the at least one of nanotubes and nanowires.

13. The method according to claim 9, wherein the sensor comprises at least one of a pressure impact sensor, a proximity sensor, a gyroscope and an accelerometer.

14. The method according to claim 9, further comprising providing a cover attached to at least a part of the mobile electronic device.

15. The method according to claim 14, wherein the deployable barrier is an inflatable deployable barrier; and further comprising storing within the cover the inflatable deployable barrier prior to deployment.

16. The method according to claim 15, wherein the inflatable deployable barrier comprises a storage container so that when deployed, a replacement storage container with a replacement deployable barrier is installable.

17. The method according to claim 14, wherein the cover comprises at least one of a backup data storage device for the mobile electronic device, a cooling system for the mobile electronic device, a financial transaction component that integrates with the mobile electronic device, and an external battery for use by the mobile electronic device.

18. The method according to claim 9, wherein the protecting the mobile electronic device comprises protecting the mobile electronic device with a plurality of sub-deployable barriers.

19. The method according to claim 18, further comprising releasing the sub-deployable barriers based on a side of the mobile electronic device is expected to make contact with at least one of a ground surface and liquid surface first.

20. The method according to claim 9, further comprising analyzing, by a processor, data from the sensor to determine a time to deploy the deployable barrier.

* * * * *